(12) United States Patent
Coulthard et al.

(10) Patent No.: US 10,425,218 B2
(45) Date of Patent: Sep. 24, 2019

(54) PHASE ROTATOR

(71) Applicant: SOCIONEXT INC., Yokohama-shi, Kanagawa (JP)

(72) Inventors: Adam James Coulthard, High Wycombe (GB); Atheer Sami Barghouthi, Maidenhead (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/005,145

(22) Filed: Jun. 11, 2018

(65) Prior Publication Data

US 2019/0089521 A1 Mar. 21, 2019

(30) Foreign Application Priority Data

Sep. 15, 2017 (EP) ..................... 17191411

(51) Int. Cl.
| | | |
|---|---|---|
| *H04L 7/00* | (2006.01) | |
| *H04L 7/033* | (2006.01) | |
| *H03K 5/135* | (2006.01) | |
| *H03L 7/00* | (2006.01) | |
| *H04J 3/04* | (2006.01) | |
| *H03L 7/081* | (2006.01) | |
| *H03L 7/08* | (2006.01) | |

(52) U.S. Cl.
CPC ........... *H04L 7/0331* (2013.01); *H03K 5/135* (2013.01); *H03L 7/00* (2013.01); *H03L 7/0814* (2013.01); *H04J 3/047* (2013.01); *H04L 7/0079* (2013.01); *H04L 7/0091* (2013.01); *H03L 7/0807* (2013.01); *H04L 7/0338* (2013.01)

(58) Field of Classification Search
CPC ... H04L 7/0331; H04L 7/0079; H03L 7/0814; H03L 7/0807
See application file for complete search history.

(56) References Cited

U.S. PATENT DOCUMENTS

| | | | |
|---|---|---|---|
| 2005/0046456 A1 | 3/2005 | D'Haene et al. | |
| 2012/0275555 A1* | 11/2012 | Ma ........................ | H04L 7/0004 |
| | | | 375/362 |
| 2017/0033918 A1* | 2/2017 | Hossain ................ | H04L 7/0087 |
| 2017/0310520 A1* | 10/2017 | Aghtar ................. | H04B 7/0817 |

FOREIGN PATENT DOCUMENTS

JP 2013-150325 A 8/2013

OTHER PUBLICATIONS

Extended European Search Report of European Patent Application No. 17191411.2 dated Jun. 7. 2018.
Partial European Search Report of European Patent Application No. 17191411.2 dated Mar. 6, 2018.

* cited by examiner

*Primary Examiner* — Dhaval V Patel
(74) *Attorney, Agent, or Firm* — Arent Fox LLP

(57) ABSTRACT

The present disclosure relates to phase alignment, in particular to phase alignment circuitry (and parts thereof) for example for use in a multiplexer or other circuitry in which data is transmitted from one stage to another. Consideration is given to phase detection and phase rotation. Such circuitry may be implemented as integrated circuitry, for example on an IC chip.

14 Claims, 16 Drawing Sheets

| Detecting Unit | Corresponding Pair of Data Receivers | Clock Signals | Inputs to NOR Gate 512 | Latch 514 Inputs Intermediate Signal | Latch 514 Inputs Driving Signal | Inputs to NOR Gate 518 | Inputs to NOR Gate 519 | Output Detection Signal |
|---|---|---|---|---|---|---|---|---|
| $510_0$ | $410_4, 410_5$ | $CLKM_4, CLKM_5$ | $RZB_4, \overline{RZB_5}$ | $Y_0$ | $RZB_4$ | $Y_1, Y_2, Y_3$ | $Y_4, Y_5, Y_6$ | $C_0$ |
| $510_1$ | $410_5, 410_6$ | $CLKM_5, CLKM_6$ | $RZB_5, \overline{RZB_6}$ | $Y_1$ | $RZB_5$ | $Y_0, Y_2, Y_3$ | $Y_4, Y_5, Y_6$ | $C_1$ |
| $510_2$ | $410_6, 410_7$ | $CLKM_6, CLKM_7$ | $RZB_6, \overline{RZB_7}$ | $Y_2$ | $RZB_6$ | $Y_1, Y_0, Y_3$ | $Y_4, Y_5, Y_6$ | $C_2$ |
| $510_3$ | $410_7, 410_0$ | $CLKM_7, CLKM_0$ | $RZB_7, \overline{RZB_0}$ | $Y_3$ | $RZB_7$ | $Y_1, Y_2, Y_0$ | $Y_4, Y_5, Y_6$ | $C_3$ |
| $510_4$ | $410_0, 410_1$ | $CLKM_0, CLKM_1$ | $RZB_0, \overline{RZB_1}$ | $Y_4$ | $RZB_0$ | $Y_1, Y_2, Y_3$ | $Y_0, Y_5, Y_6$ | $C_4$ |
| $510_5$ | $410_1, 410_2$ | $CLKM_1, CLKM_2$ | $RZB_1, \overline{RZB_2}$ | $Y_5$ | $RZB_1$ | $Y_1, Y_2, Y_3$ | $Y_4, Y_0, Y_6$ | $C_5$ |
| $510_6$ | $410_2, 410_3$ | $CLKM_2, CLKM_3$ | $RZB_2, \overline{RZB_3}$ | $Y_6$ | $RZB_2$ | $Y_1, Y_2, Y_3$ | $Y_4, Y_5, Y_0$ | $C_6$ |

FIG. 4B

PHASE ROTATOR

CROSS-REFERENCE TO RELATED APPLICATIONS

This application claims priority from European Patent Application No. 17191411.2 filed Sep. 15, 2017. The entire contents of this application are incorporated herein by reference.

The present invention relates to phase alignment, in particular to phase alignment circuitry (and parts thereof) for example for use in a multiplexer or other circuitry in which data is transmitted from one stage to another. Such circuitry may be implemented as integrated circuitry, for example on an IC chip.

In such circuitry, data may be transmitted as a data signal from one (e.g. multiplexing) circuit stage via a signal line (such as a transmission line) to another circuit stage where it is received. Both stages may operate in dependence upon respective clock signals. It is important to be able to latch the received data based on the corresponding clock signal accurately and safely, in circumstances where the delay over the signal line may be unknown or may vary e.g. over process, voltage and temperature (PVT).

With increasing speeds of such circuitry, and corresponding miniaturisation of semiconductor device sizes, there is ever increasing pressure on operating such circuitry accurately.

It is desirable to provide improved circuitry in the light of the above.

According to an embodiment of a first aspect of the present invention, there is provided multiplexer circuitry, comprising: a data transmitter configured to transmit a data signal across a signal line based on a transmission clock signal; a control unit comprising a data receiver and a phase detector, wherein the data receiver is configured to receive the data signal from the signal line based on a reception clock signal and to generate an output signal based on the received data signal and synchronized with the reception clock signal, and wherein the phase detector is configured to measure a phase of the received data signal relative to a phase of the reception clock signal based on said output signal and to output a control signal indicative of a difference between the measured phase and a target phase of the received data signal; and a phase rotator configured to adjust the phase of the transmission clock signal based on the control signal to bring the measured phase towards or to the target phase.

Such circuitry enables the phase of the transmission clock signal to be adjusted, e.g. dynamically, so that the data signal is recovered accurately in the data receiver. Such adjustment may be carried out over time to initially calibrate operation of the circuitry and then compensate for e.g. voltage or temperature variations.

The data transmitter may for example generate its data signal by multiplexing a plurality of input data signals. However, in some arrangements the data signal transmitted by the data transmitter may be generated from a single input data signal, in which case the circuitry of the present aspect may be referred to simply as data transmission circuitry.

The data transmitter may be configured to transmit the data signal based on the transmission clock signal, in the sense that the data signal is synchronised with that clock signal. Put another way, the data transmitter may be considered clocked by the transmission clock signal. The data receiver may be considered similarly clocked by its reception clock signal, such that its output signal is synchronised with that clock signal.

The phase detector may be configured to measure the phase of the received data signal relative to the phase of the reception clock signal in the sense of indicating whether the phase of one is ahead of or behind the phase of the other.

The reception clock signal and the transmission clock signal may have a set frequency relationship and/or may maintain a phase relationship between the phase adjustments. For example, the frequency of the reception clock signal may be twice (or three times, etc.) the frequency of the transmission clock signal. The frequency ratio may be application dependent.

The phase detector may be configured to measure the phase of the received data signal by detecting (a phase or time position of) an edge of the received data signal relative to (a phase or time position of) an edge of the reception clock signal.

The output signal may comprise a pulse signal having pulses synchronised with edges of the reception clock signal, each pulse indicative of a data value (e.g. logic 1 or 0) of the data signal at a corresponding said edge. The corresponding edges may be rising edges. The corresponding edges may be falling edges. The edges may be corresponding edges in that were the two clock signals to be in phase with one another they would occur at the same time.

The output signal may comprise a first pulse signal having pulses synchronised with edges of the reception clock signal at which the data signal has a logic 1 data value and/or a second pulse signal having pulses synchronised with edges of the reception clock signal at which the data signal has a logic 0 data value.

The edges with which the pulses are synchronised may be rising edges. The edges with which the pulses are synchronised may be falling edges. The pulses may be synchronised with edges of the reception clock signal at which the data signal has a logic 1 data value in the sense that the pulses occur (or start) simultaneously or are aligned with edges of the reception clock signal that occur when the data signal has a logic 1 data value. The pulses may be synchronised with edges of the reception clock signal at which the data signal has a logic 0 data value in the sense that the pulses occur (or start) simultaneously or are aligned with edges of the reception clock signal that occur when the data signal has a logic 0 data value. The data signal may have a logic 1 data value in the sense that the data signal has a high voltage value (e.g. VDD). The data signal may have a logic 0 data value in the sense that the data signal has a low voltage value (e.g. GND).

The control unit may comprise a pair of said data receivers each configured to receive the data signal from the signal line based on a corresponding reception clock signal and to generate a corresponding said output signal. The reception clock signals may have different relative phases from one another so that the output signals have associated different relative phases from one another, and the phase detector may be configured to determine that an edge of the data signal is between corresponding edges of the reception clock signals of the pair (in time) if the pulses from the data receivers of the pair which are synchronised with those edges indicate opposite data values (e.g. 0 and 1 or vice versa).

A pulse from a data receiver of the pair may be synchronised with an edge of a corresponding reception clock signal in the sense that the pulse indicates a data value that the data signal has at a time when the edge of the reception clock signal occurs. An edge of the data signal may be between corresponding edges of the reception clock signals of the pair (in time) in the sense that an edge of a first one of those reception clock signals is followed (in time) by the edge of the data signal, and the edge of the data signal is then followed (in time) by an edge of the other one of those reception clock signals (which corresponds to the edge of the first reception clock signal). The pulses from the data receivers of the pair which are synchronised with the edges may indicate opposite data values in the sense that the pulse from one of the data receivers of the pair indicates that the data signal has a logic 1 data value (or a high value) and the pulse from the other data receiver of the pair indicates that the data signal has a logic 0 data value (or a low value), or vice versa.

The phase detector may be configured to determine that an edge of the data signal is between corresponding edges of the reception clock signals of the pair (in time) if a pulse indicating a data value 0 from one of the data receivers of the pair overlaps (in time) with a pulse indicating a data value 1 from the other one of the data receivers of the pair.

A pulse indicating a data value 0 from one of the data receivers of the pair may overlap with a pulse indicating a data value 1 from the other one of the data receivers of the pair in the sense that at least a portion of one of the pulses occurs at the same time as at least a portion of the other pulse is occurring.

The pulses may be logic 1 pulses and the phase detector may be operable to detect the overlap by performing an AND function on the output signals of the pair. The pulses may be logic 0 pulses and the phase detector may be operable to detect the overlap by performing a NOR function on the output signals of the pair.

The control unit may comprise a set of data receivers operable based on a corresponding set of reception clock signals, the set of reception clock signals being time-interleaved such that they have different relative phases from one another. The set of data receivers may be organised into a plurality of said pairs, the phase detector configured, for each said pair, to determine whether an edge of the data signal is between corresponding edges of the reception clock signals of the pair.

The set of data receivers may be operable based on a corresponding set of reception clock signals in the sense that each data receiver is operable based on a corresponding one of the set of reception clock signals. A data receiver of the set of data receivers may be operable based on a corresponding reception clock signal of the set of reception clock signals in the sense that the data receiver is clocked by the corresponding reception clock signal, so that the data receiver's output is synchronised with the corresponding reception clock signal. The set of reception clock signals may be time-interleaved such that they have different relative phases from one another in the sense that the reception clock signals have the same frequency as one another, but different phases from one another.

The data receivers of the control unit may be connected such that the reception clock signals for each said pair have adjacent phases from the phases of the set of reception clock signals, so that the phase detector determines for which pair of phase-adjacent reception clock signals the edge of the data signal lies between edges of those reception clock signals (in time).

The reception clock signals for each said pair may have adjacent phases in the sense that the phase of no other reception clock signal of the set of reception clock signals falls within the range of phases between the phases of the reception clock signals of the pair.

The phase detector may comprise a latch for each pair of data receivers. Each latch may be configured, when an overlap is detected for its pair of data receivers, to output an overlap signal, and, when an overlap is detected for another pair of data receivers, to output a non-overlap signal.

An overlap may be detected for a pair of data receivers corresponding to a latch in the sense that it is detected that an edge of the data signal is between corresponding edges of the reception clock signals of the pair (in time). For example, the pulses from the data receivers of the pair which are synchronised with those edges may indicate opposite data values, or e.g. a pulse indicating a logic 0 data value (or low) from one of the data receivers of the pair may overlap (in time) with a pulse indicating a logic 1 data value (or high) from the other one of the data receivers of the pair.

Each latch may be configured to maintain an output overlap signal until the detection of an overlap for another pair of data receivers causes it to output a non-overlap signal, and maintain an output non-overlap signal until an overlap detected for its pair of data receivers causes it to output an overlap signal.

Each latch may be configured to maintain an output overlap signal by e.g. maintaining a signal with logic 0 data value (or logic 1 data value). Each latch may be configured to maintain an output non-overlap signal by e.g. maintaining a signal with logic 1 data value (or logic 0 data value).

The phase rotator may be configured to adjust the phase of the transmission clock signal by selecting as the transmission clock signal a clock signal from among a plurality of candidate time-interleaved clock signals that are phase shifted relative to each other.

The plurality of candidate clock signals may be time interleaved and phase shifted relative to one another in the sense the candidate clock signals have the same frequency as one another but different phases from one another.

The phase rotator may comprise a plurality of input nodes configured to receive respective clock signals of the plurality of candidate clock signals, an output node, and selector circuitry operable, based on the control signal, to adjust which one of the candidate clock signals is selected to be output at the output node via a corresponding path through the selector circuitry. The phase rotator may be configured such that the propagation delays of the candidate clock signals between the input and output nodes when selected are the same as one another. In this way, there may be no or negligible delay implications relating to adjusting which one of the candidate clock signals is selected to be output at the output node.

The selector circuitry may be operable based on the control signal in the sense that the operation of the selector circuitry (i.e. its output) depends on the control signal. The selector circuitry may adjust which one of the candidate clock signals is selected to be output at the output node in the sense that the selector circuitry outputs one candidate clock signal instead of another. A candidate clock signal may be selected to be output at the output node via a corresponding path through the selector circuitry in the sense that a signal passes through a particular combination of logic gates to cause the candidate clock signal to be output at the output node.

The path lengths through the selector circuitry may be the same for each candidate clock signal.

The path lengths may be the same in the sense that a propagation delay suffered by a signal passing through a combination of logic gates to cause a candidate clock signal to be output at the output node is the same irrespective of which candidate clock signal is output at the output node.

The selector circuitry may comprise a plurality of logic gates via which the paths pass, and the paths may comprise the same combinations of logic gates and interconnecting path lengths as one another. That is, although different paths may pass through different logic gates, the combination of types of gate for each path may be the same.

The selector circuitry may be operable, based on the control signal, to adjust which one of an array of clock-select signals has a select state, the other clock-select signals of the array having a deselect state; and the selector circuitry may be configured such that the clock-select signal having the select state causes a corresponding one of the candidate clock signals to be output as the transmission clock signal.

For example, the array of clock-select signals may be a multiple-bit signal. One of the array of clock-select signals may have a select state in the sense that one bit of the multiple-bit select signal has a logic 1 data value. The other clock-select signals of the array may have a deselect state in the sense that each bit of the multiple-bit select signal other than the bit with logic 0 data value has a logic 1 data value. The clock-select signal having the select state may cause a corresponding one of the candidate clock signals to be output as the transmission clock signal in the sense that it causes a signal to pass through a particular combination of logic gates to cause the one candidate clock signal to be output as the transmission clock signal.

The selector circuitry may comprise a shift register operable to output the array of clock-select signals, and may be operable to adjust which one of the array of clock-select signals has the select state by shifting values held in the shift register.

For example, the shift register may output the multiple-bit signal as the array of clock-select signals. Values held in the shift register may be shifted in the sense that the bits of the multiple-bit signal are shifted such that a different one of the bits has logic 1 data value.

The selector circuitry may comprise a plurality of clocked latches connected together in series via which the control signal is provided to the shift register, the clocked latches being clocked by the same timing clock signal. This may provide a degree of metastability protection.

The control signal may be provided to the shift register via a plurality of clocked latches connected in series in the sense that the selection signal passes through each of the plurality of clocked latches before being input to the shift register. The clocked latches may be clocked by the same timing clock signal in the sense that a signal output from each latch is synchronised with the same timing clock signal.

The selector circuitry may comprise a further clocked latch clocked by the timing clock signal via which the array of clock-select signals is latched before controlling which one of the candidate clock signals is output as the transmission clock signal.

The array of clock-select signals may be latched by a further clocked latch in the sense that the array of clock-select signals are received by the further clocked latch and output by the clocked latch synchronised with the timing clock signal.

The selector circuitry may be operable, based on the control signal, to output one or more further said candidate clock signals having a given phase relationship to the candidate clock signal serving as the transmission clock signal.

The further said candidate clock signals may have a given phase relationship to the candidate clock signal serving as the transmission clock signal in the sense that there is a set phase difference between each further candidate clock signal and the candidate clock signal serving as the transmission clock signal. Thus, an adjustment of which candidate clock signal is serving as the transmission clock signal causes a corresponding change in the phases of the further candidate clock signals, so that the set phase difference is preserved.

The data transmitter may be a multiplexer stage of the multiplexer circuitry, operable to generate the data signal based on a plurality of input data signals.

The data transmitter, signal line, and the or a particular one of the data receivers of the control unit may constitute a first (e.g. "dummy") data channel of the multiplexer circuitry; and the multiplexer circuitry may comprise at least a further (e.g. "real" or "actual") data channel, whose transmission clock signal is held in a given phase relationship with the transmission clock signal of the first data channel and whose reception clock signal is held in a given phase relationship with the reception clock signal of the first data channel.

A transmission clock signal of a further data channel may be held in a given phase relationship with the transmission clock signal of the first data channel in the sense that there is a set phase difference between the two clock signals, such that when there is a change in the transmission clock signal of the first data channel (e.g. a change in phase) there is a change in the transmission clock signal of the further data channel so that the set phase difference is preserved. A reception clock signal of a further data channel may be held in a given phase relationship with the reception clock signal of the first data channel in a similar manner.

The first data channel may operate as a "dummy" data channel and the further data channel may be a data channel that receives and transmits actual data.

The multiplexer circuitry may comprise a plurality of further data channels; and the transmission clock signals of the further data channels may be time-interleaved such that they maintain different relative phases from one another and the reception clock signals of the further data channels may be correspondingly time-interleaved.

The transmission clock signals of the further data channels may be time-interleaved such that they maintain different relative phases from one another in the sense that they have the same frequency as one another but different relative phases from one another.

The multiplexer circuitry may be implemented as integrated circuitry optionally on an IC chip.

According to an embodiment of a second aspect of the present invention, there is provided integrated circuitry such as an IC chip comprising the multiplexer circuitry of the aforementioned first aspect of the present invention.

According to an embodiment of a third aspect of the present invention, there is provided a digital-to-analogue converter comprising the multiplexer circuitry of the aforementioned first aspect of the present invention.

According to an embodiment of a fourth aspect of the present invention, there is provided a data transmission method, comprising transmitting a data signal across a signal line based on a transmission clock signal; receiving the data signal from the signal line based on a reception clock signal and generating an output signal based on the received data signal and synchronized with the reception clock signal; measuring a phase of the received data signal relative to a phase of the reception clock signal based on said output signal and outputting a control signal indicative of a difference between the measured phase and a target phase of the received data signal; and adjusting the phase of the transmission clock signal based on the control signal to bring the measured phase towards or to the target phase.

According to an embodiment of a fifth aspect of the present invention, there is provided phase detector circuitry for measuring the phase of a data signal received from a signal line, the phase detector circuitry comprising a pair of data receivers each configured to receive the data signal from the signal line based on a corresponding reception clock signal and to generate an output signal based on the received data signal and synchronized with the corresponding reception clock signal; and a phase detector configured to measure a phase of the received data signal relative to phases of the reception clock signal based on said output signals, wherein the reception clock signals have different relative phases from one another so that the output signals have associated different relative phases from one another.

The phase detector may be configured to measure the phase of the received data signal by detecting (a phase or time position of) an edge of the received data signal relative to (a phase or time position of) edges of the reception clock signals.

Each output signal may comprise a pulse signal having pulses synchronised with edges of the reception clock signal concerned, each pulse indicative of a data value of the data signal at a corresponding said edge.

Each output signal may comprise a first pulse signal having pulses synchronised with edges of the reception clock signal concerned at which the data signal has a logic 1 data value; and/or a second pulse signal having pulses synchronised with edges of the reception clock signal concerned at which the data signal has a logic 0 data value.

The phase detector may be configured to determine that an edge of the data signal is between corresponding edges of the reception clock signals of the pair (in time) if the pulses from the data receivers of the pair which are synchronised with those edges indicate opposite data values.

The phase detector may be configured to determine that an edge of the data signal is between corresponding edges of the reception clock signals of the pair (in time) if a pulse indicating a data value 0 from one of the data receivers of the pair overlaps (in time) with a pulse indicating a data value 1 from the other one of the data receivers of the pair.

The pulses may be logic 1 pulses and the phase detector may be operable to detect the overlap by performing an AND function on the output signals of the pair.

The pulses may be logic 0 pulses and the phase detector may be operable to detect the overlap by performing a NOR function on the output signals of the pair.

The phase detector circuitry may comprise a set of data receivers operable based on a corresponding set of reception clock signals, the set of reception clock signals being time-interleaved such that they have different relative phases from one another, wherein the set of data receivers may be organised into a plurality of said pairs; and the phase detector may be configured, for each said pair, to determine whether an edge of the data signal is between corresponding edges of the reception clock signals of the pair.

The data receivers of the control unit may be connected such that the reception clock signals for each said pair have adjacent phases from the phases of the set of reception clock signals, so that the phase detector determines for which pair of phase-adjacent reception clock signals the edge of the data signal lies between edges of those reception clock signals (in time).

The phase detector may comprise a latch for each pair of data receivers; and each latch may be configured, when an overlap is detected for its pair of data receivers, to output an overlap signal, and, when an overlap is detected for another pair of data receivers, to output a non-overlap signal.

Each latch may be configured to maintain an output overlap signal until the detection of an overlap for another pair of data receivers causes it to output a non-overlap signal, and maintain an output non-overlap signal until an overlap detected for its pair of data receivers causes it to output an overlap signal.

The phase detector circuitry may be implemented as integrated circuitry optionally on an IC chip.

According to an embodiment of a sixth aspect of the present invention, there is provided multiplexer circuitry comprising the phase detector circuitry of the aforementioned fifth aspect of the present invention.

According to an embodiment of a seventh aspect of the present invention, there is provided integrated circuitry such as an IC chip comprising the phase detector circuitry of the aforementioned fifth aspect of the present invention.

According to an embodiment of an eighth aspect of the present invention, there is provided a digital-to-analogue converter comprising the phase detector circuitry of the aforementioned fifth aspect of the present invention.

According to an embodiment of a ninth aspect of the present invention, there is provided a method of measuring the phase of a data signal received from a signal line, the method comprising at each of a pair of data receivers receiving the data signal from the signal line based on a corresponding reception clock signal and generating an output signal based on the received data signal and synchronized with the corresponding reception clock signal; and measuring a phase of the received data signal relative to phases of the reception clock signal based on said output signals, wherein the reception clock signals have different relative phases from one another so that the output signals have associated different relative phases from one another.

According to an embodiment of a tenth aspect of the present invention, there is provided phase rotator circuitry, comprising a plurality of input nodes configured to receive respective clock signals of a plurality of time-interleaved candidate clock signals which have different phases from one another; an output node; and selector circuitry operable, based on a selection signal, to adjust which one of the candidate clock signals is selected to be output at the output node via a corresponding path through the selector circuitry, wherein the phase rotator circuitry is configured such that the propagation delays of the candidate clock signals between the input and output nodes when selected are the same as one another.

The path lengths through the selector circuitry may be the same for each candidate clock signal.

The selector circuitry may comprise a plurality of logic gates via which the paths pass, and the paths may comprise the same combinations of logic gates and interconnecting path lengths as one another.

The selector circuitry may be operable, based on the selection signal, to adjust which one of an array of clock-select signals has a select state, the other clock-select signals of the array having a deselect state; and the selector circuitry may be configured such that the clock-select signal having the select state causes a corresponding one of the candidate clock signals to be output as the transmission clock signal (and the clock-select signals having the deselect state cause corresponding ones of the candidate clock signals to not be output as the transmission clock signal).

The selector circuitry may comprise a shift register operable to output the array of clock-select signals, and may be operable to adjust which one of the array of clock-select signals has the select state by shifting values held in the shift register.

The selector circuitry may comprise a plurality of clocked latches connected together in series via which the selection signal is provided to the shift register, the clocked latches being clocked by the same timing clock signal.

The selector circuitry may comprise a further clocked latch clocked by the timing clock signal via which the array of clock-select signals is latched before controlling which one of the candidate clock signals is output as the transmission clock signal.

The selector circuitry may be operable, based on the selection signal, to output one or more further said candidate clock signals having a given phase relationship to the candidate clock signal serving as the transmission clock signal.

Features of method aspects may apply equally to apparatus (circuitry) aspects, and vice versa.

Reference will now be made, by way of example, to the accompanying drawings, of which:

FIG. 4B is a table useful for understanding how a set of such phase detecting units may be connected;

Figure 1:
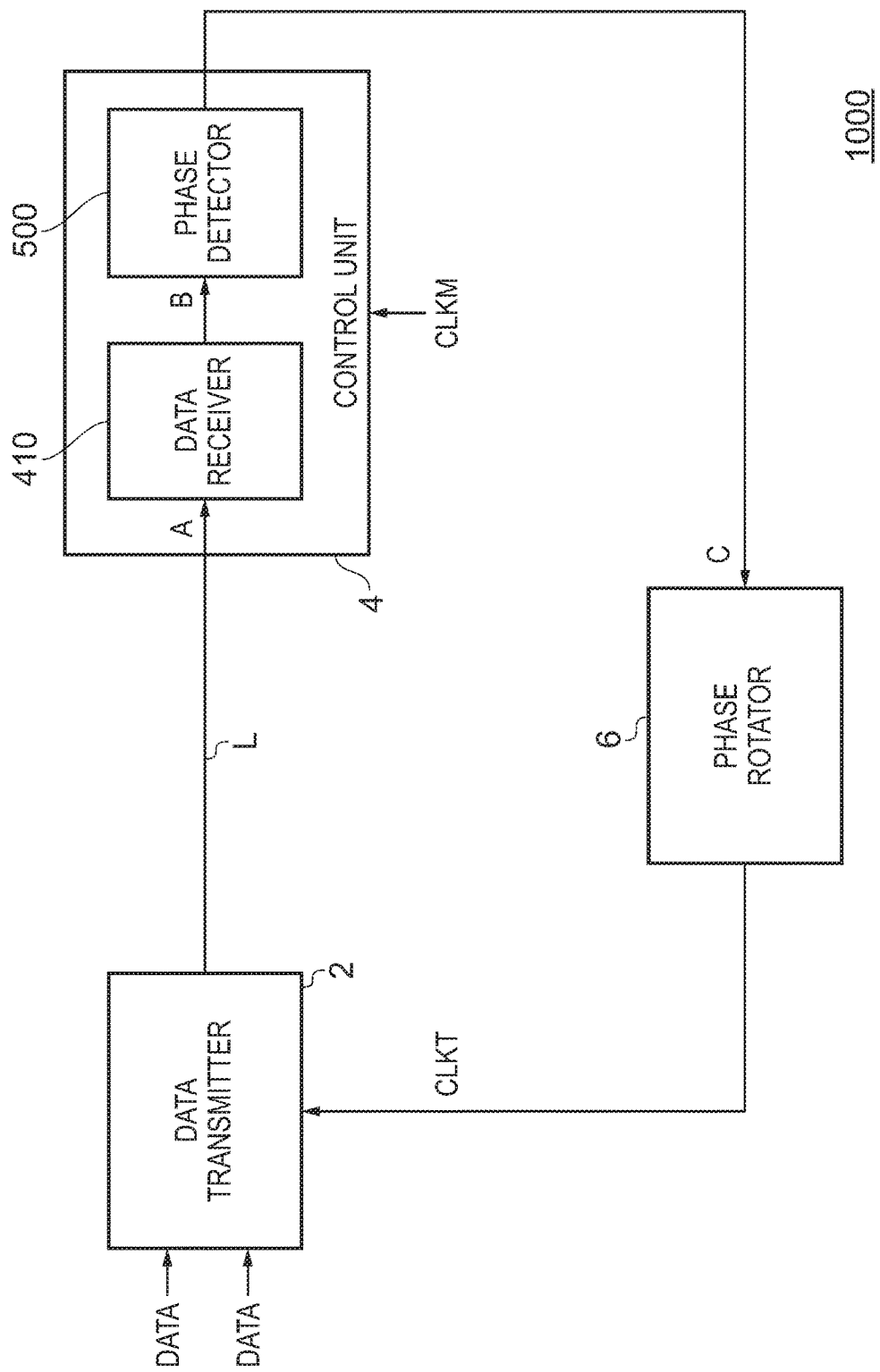
FIG. 1 is a schematic diagram of multiplexer circuitry.

FIG. 1 is a schematic diagram of multiplexer circuitry 1000. Multiplexer circuitry 1000 comprises a data transmitter 2, a signal line L, a control unit 4 and a phase rotator 6. The control unit 4 comprises a data receiver 410 and a phase detector 500.

The data transmitter 2 is connected to transmit a data signal A across the signal line L, according to a transmission clock signal CLKT which the data transmitter 2 is connected to receive from the phase rotator 6. The data receiver 410 of the control unit 4 is connected to receive the data signal A from the signal line L according to a measurement clock signal CLKM (being a reception clock signal).

The data receiver 410 is operable to generate an output signal B based on the received data signal A and synchronised with the measurement clock signal CLKM, and to transmit the output signal B to the phase detector 500. The phase detector 500 is operable to measure a phase of the data signal A relative to a phase of the measurement clock signal CLKM based on the output signal B, and to output to the phase rotator 6 a control signal C indicative of a difference between the measured phase and a target phase of the data signal L.

The phase rotator 6 is connected to receive the control signal C and is operable to adjust a phase of the transmission clock signal CLKT based on the control signal C to bring the measured phase towards or to a target phase.

The data transmitter 2 is a multiplexer or a multiplexing stage of a multiplexer (and is hence shown having two data inputs as an example), however it may be any other component or circuitry that transmits data according to a clock signal (in which case multiplexer circuitry 1000 may be referred to as data transmission circuitry, and it may be that only one data input is provided). The present disclosure will be understood accordingly.

The signal line L may be a long-distance signal line, for example it may be a 150 μm to 900 μm, or 300 μm to 400 μm, transmission line implemented in a 16 nm process. The data signal A may be transmitted across the signal line L with a reduced-voltage swing to save power, and as such the signal line may be referred to as a low-swing data bus. The data receiver 410 may be a latch, or it may be another component or circuit capable of receiving and transmitting data according to a clock signal. The data receiver 410 may, when it receives the data signal according to the measurement clock signal CLKM, restore the data to full swing if it was transmitted across the signal line L at reduced voltage swing to save power. The data receiver 410 may, for example, be implemented as a strongARM latch. In this respect, reference may be made to EP3217291 and EP3217548, the entire contents of which are incorporated herein by reference.

The phase detector 500 may consist of latch circuitry, or other circuitry capable of measuring a phase of a data signal relative to a clock signal phase. The phase detector 500 may output the control signal C in the form of one or more control bits.

The phase rotator 6 may receive the control signal C in the form of one or more control bits, and may be configured to adjust the phase of the transmission clock signal CLKT based on the one or more control bits. The phase rotator 6 may select as the transmission clock signal CLKT a clock signal from among a plurality of candidate time-interleaved clock signals, for example based on the one or more control bits received from the phase detector 500.

The propagation of data signal A along signal line L may lead to a delay, such that data signal A, when received after signal line L, is not in time or sufficiently aligned with the measurement clock signal or with a target clock signal to allow it to be successfully recovered after the signal line L. With this in mind, the transmission clock signal may be rotated in phase such that the data signal A, after propagating across the signal line L, is in time with the target clock signal and can thus be successfully recovered.

Although not shown in FIG. 1, in the case of a multiplexer, it may be that the measurement clock signal CLKM (and any corresponding target clock signal) at the receiving side needs to be at a higher frequency than the transmission clock signal CLKT. For example, if the data transmitter performs a 2:1 multiplexing operation, the measurement clock signal CLKM (and any corresponding target clock signal) at the receiving side may be at twice the frequency of the transmission clock signal CLKT. As an example, the phase rotator may receive a set of time-interleaved (i.e. mutually phase-shifted) clock signals including the measurement clock signal CLKM and adjust which one of those clock signals is output so as to adjust its output clock signal, that output signal passing via a divide-by-two clock divider to form the transmission clock signal CLKT. Merely as an example, the data transmitter may be configured to receive two 1 GHz data signals and, based on a 2 GHz transmission clock signal CLKT, to multiplex those signals as a 2 GHz data signal over the transmission line L. The data receiver 410 may then be operable based on a 4 GHz clock signal (corresponding to the measurement clock signal CLKM) to latch the received data signal.

In a running example, the data receiver 410 is one of a set of eight identical data receivers $410_0$, $410_1$, $410_2$, $410_3$, $410_4$, $410_5$, $410_6$ and $410_7$. The data receivers $410_0$ to $410_7$ are clocked by measurement clock signals $CLKM_0$, $CLKM_1$, $CLKM_2$, $CLKM_3$, $CLKM_4$, $CLKM_3$, $CLKM_6$ and $CLKM_7$, respectively. The measurement clock signals are time-interleaved, for example equally time-interleaved, such that they have different relative phases from (but the same frequency as) one another. Each data receiver $410_0$ to $410_7$ is connected to receive the data signal A according to its corresponding measurement clock signal, and output an output signal based on the received data signal A and synchronised with its corresponding measurement clock signal.

In the running example, the set of data receivers $410_0$ to $410_7$ is organised into a plurality of pairs, and the set of measurement clock signals $CLKM_0$ to $CLKM_7$ is similarly organised, with each pair of measurement clock signals corresponding to a pair of data receivers. The organisation of the data receivers and the measurement clock signals is such that measurement clock signals of each pair have phases adjacent to each other. The organisation is also such that certain data receivers and their measurement clock signals belong to two pairs.

The above-mentioned running example will be adopted hereinafter to assist in understanding the present invention, however it will be appreciated that in practice any number of data receivers 410 may be employed and how they are organised and clocked may vary from one implementation to another.

Figure 2:
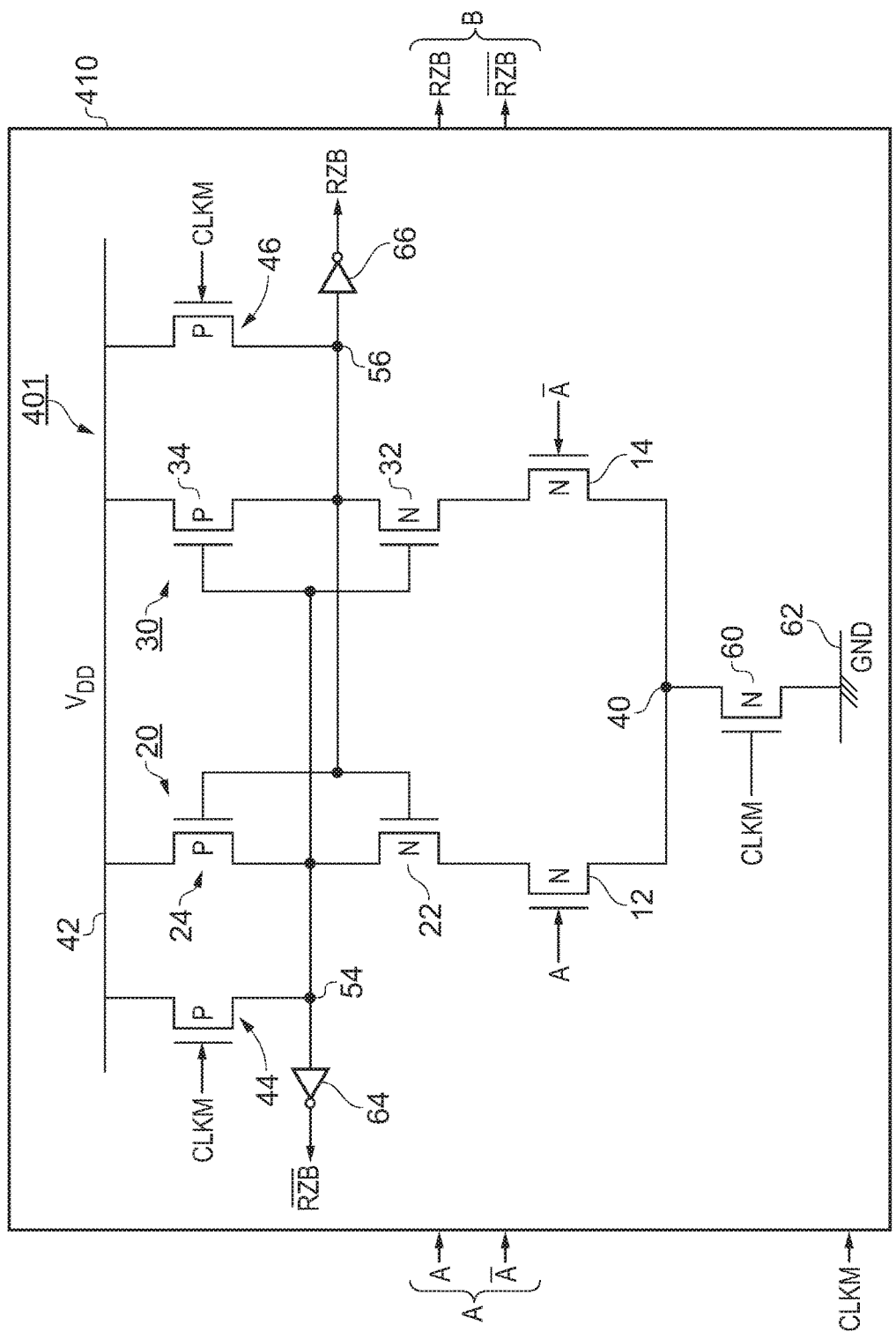
FIG. 2 is a schematic diagram of the data receiver of FIG. 1.

FIG. 2 is a schematic diagram representative of one of the data receivers $410_0$ to $410_7$, here denoted 410 for simplicity.

The data receiver 410 is shown in FIG. 2 both in "black box" form, simply indicating inputs and outputs so that its overall function may be understood, and also in detailed form, indicating one particular example of circuitry 401 which is configured to perform the overall function.

The data receiver 410 receives the data signal A and outputs the output data signal B. In the running example, the data signal A is a differential signal, comprising A and /A components (the signal line L being a differential signal or transmission line), and the data signal B is a pair of information signals, in this case differential RTZ (Return-To-Zero) signals. The meaning of "differential RTZ" signals will be understood with reference to FIG. 3 which is described in more detail below.

Thus, the data signal A is input to the data receiver 410 as its component parts A and /A, and the output data signal B output from data receiver 410 is RTZ differential pair RZB and /RZB. Data receiver 410 also receives its corresponding measurement clock signal CLKM (i.e. the corresponding one of $CLKM_0$ to $CLKM_7$) as an input.

The example circuitry 401 of the data receiver 410 shown in FIG. 2 may readily be described as a strongARM latch or a clocked latch.

The circuitry 401 comprises first and second input transistors 12 and 14, two cross-coupled pairs of transistors 22, 32, 24 and 34 making up inverters 20 and 30, a common tail node 40, a first reference voltage source 42, first and second precharge (setup) transistors 44 and 46, inverter output nodes 54 and 56, a clocked (evaluate) transistor 60, a second reference voltage source 62, and output inverters 64 and 66.

Gate terminals of the input transistors 12 and 14 receive the signals A and /A, respectively.

The two cross-coupled pairs of transistors 22, 32, 24 and 34 are connected together to form the cross-coupled inverters 20 and 30. The outputs of these inverters 20 and 30 provided at the output nodes 54 and 56 provide the ultimate outputs of the circuitry 401, albeit via the inverters 64 and 66.

The input transistors 12 and 14 are connected between the common tail node 40 and the cross-coupled inverters 20 and 30, respectively.

The cross-coupled inverters 20 and 30 are connected between the input transistors 12 and 14 and the first reference voltage source 42, in this case VDD. Specifically, inverter 20 is connected between the first input transistor 12 and the first reference voltage source 42, and the inverter 30 is connected between the second input transistor 14 and the first reference voltage source 42. The output of the inverter 20 is connected to the output node 54, and the output of the inverter 30 is connected to the output node 56.

In the present example, the transistors 12, 14, 22, 32 and 60 are NMOS MOSFETs, and the transistors 24, 34, 44 and 46 are PMOS MOSFETs. The transistors 44, 46 and 60 are connected to receive the measurement clock signal CLKM at their gate terminals.

The inverters 64 and 66 are provided respectively at the output nodes 54 and 56 to provide the ultimate circuit outputs /RZB and RZB.

Figure 3:
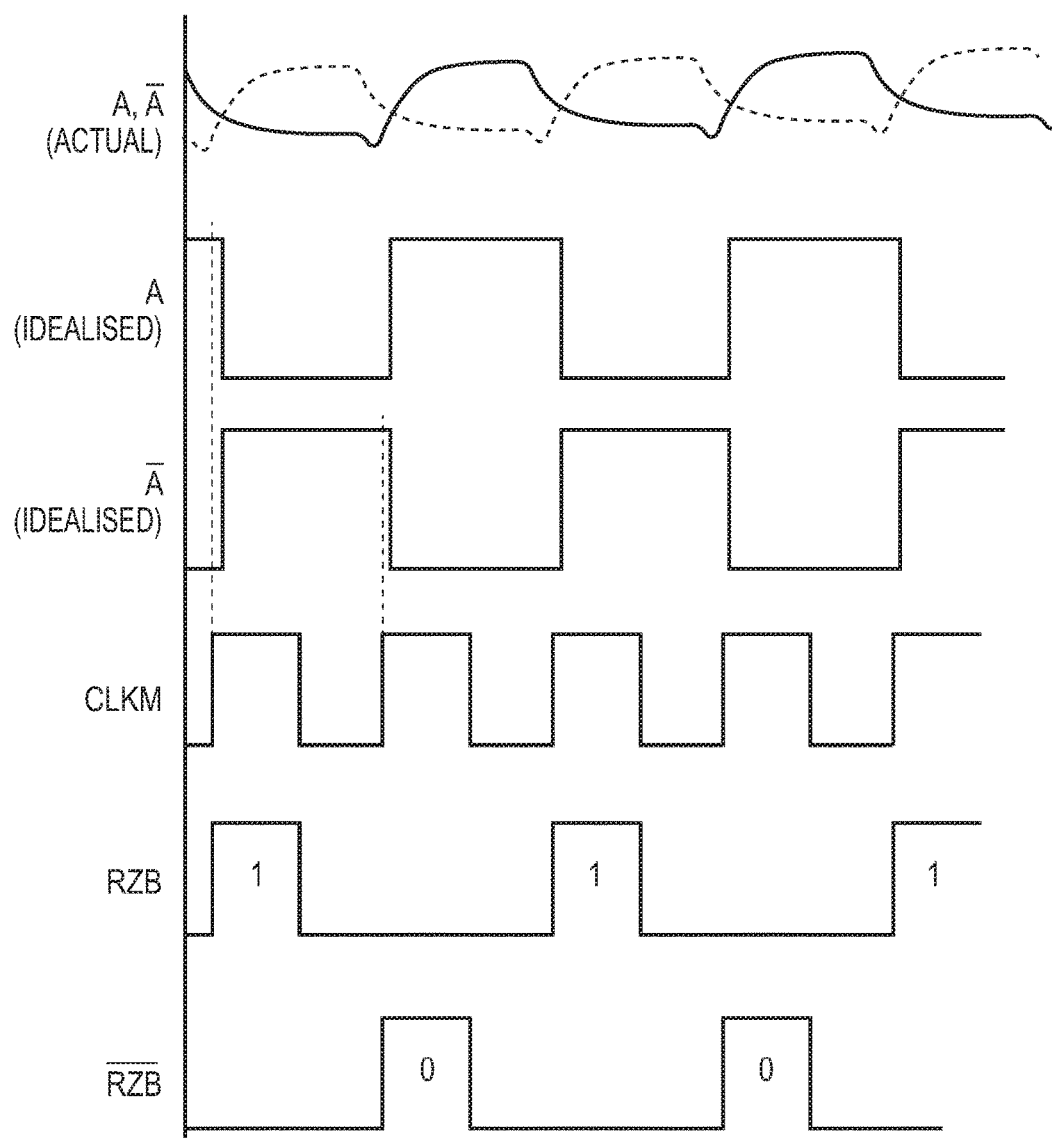
FIG. 3 is a signal timing diagram useful for understanding the circuitry of FIG. 2.

FIG. 3 is a signal timing diagram useful for understanding the operation of the circuitry of FIG. 2.

It is assumed for the purpose of this example that data signal A takes the form illustrated in FIG. 3. To achieve such a form for the data signal A, the data transmitter 2 may be, for example, a 2:1 multiplexer as mentioned above. The multiplexer 2 may multiplex a logic high signal (a data signal having a continuous data value of 1) with a logic low signal (a data signal having a continuous data value of 0) according to the transmission clock signal CLKT, i.e. it may output one of the signals when the transmission clock signal CLKT is high and the other signal when the transmission clock signal CLKT is low. Thus, the data signal A alternates between logic high (e.g. digital 1) and logic low (e.g. digital 0).

The data signals A and /A are shown together in a form in which they may be expected to be received at the data receiver 410, i.e. as non-ideal (and perhaps reduced swing) square waves which have been transmitted across the signal line L, and also individually as corresponding idealised square waves to aid in an understanding of the operation.

The measurement clock signal CLKM which is input to the data receiver 410 is at twice the frequency of the transmission clock signal CLKT. It can be seen that the data receiver 410 generates outputs RZB and /RZB based on its inputs A, /A, and measurement clock signal CLKM as indicated in FIG. 3.

When the measurement clock signal CLKM is low, the circuitry 401 is in its "reset phase" and as such the signals RZB and /RZB are both low, as can be seen in FIG. 3. This is because when the measurement clock signal CLKM is low, transistor 60 is OFF (preventing current flow through node 40) and transistors 44 and 46 are ON, charging nodes 54 and 56 up to logic high or VDD (with the inverters 64 and 66 thus giving low outputs).

When measurement clock signal CLKM is high, the circuitry 401 is in its "active phase", and thus either signal RZB or /RZB is high depending on the value of data signal A. This is because when measurement clock signal CLKM is high, transistor 60 is ON (allowing current to flow through node 40) and transistors 44 and 46 are OFF. Moreover, the signals A and /A are such that one of the transistors 12 and 14 is more ON than the other (in the idealised case, one is ON while the other is OFF), so that there is an imbalance between the current flowing between transistors 12 and 22 and that flowing between transistors 14 and 32.

In particular, taking the example where a digital "1" is expressed by A having a higher voltage than /A (in the idealised case, A having logic high and /A having logic low), transistor 12 is more ON than transistor 14. Thus more current is permitted to flow through node 40 and between transistors 12 and 22, than between transistors 14 and 32 (where no current flows in the idealised case). This imbalance affects the operation of the cross-coupled inverters 20 and 30, which amplify this imbalance causing one of the nodes 54 and 56 to go high and the other to go low. In this example, when transistor 12 is more ON than transistor 14, node 56 is pulled down and thus node 54 goes high, leading to RZB going high and /RZB going (or effectively remaining) low (ignoring for the purpose of this example the brief transitional state while the cross-coupled inverters 20 and 30 accelerate their outputs to their eventual states).

It will be appreciated that although the foregoing example has been described with a return-to-zero differential pair, the output signals RZB and /RZB could also be provided as return-to-one signals, for example with the addition of inverters at relevant positions in the circuitry (or the omission of inverters 64 and 66). Further, although in the foregoing example the circuitry 401 was configured to sample the data signal A when the measurement clock signal CLKM was high, i.e. at a rising edge of the measurement clock signal CLKM, the circuitry 401 could also be configured to sample the data signal A at a falling edge of the measurement clock signal CLKM, for example with the addition of inverters at relevant positions in the circuitry, or by swapping NMOS MOSFETs for PMOS MOSFETs and vice versa.

Note from FIG. 3 that the example data signal A does not transition from high to low exactly when the measurement clock signal CLKM transitions, so the example output signals RZB and /RZB shown effectively indicate that the data signal A is transitioning just after the rising edges of measurement clock signal CLKM. The strongARM latch arrangement of FIG. 2 enables such small differences between A and /A to be detected.

Based on a consideration of FIGS. 2 and 3, it will be understood that the data receivers $410_0$ to $410_7$ of the running example output signals $B_0$, $B_1$, $B_2$, $B_3$, $B_4$, $B_5$, $B_6$ and $B_7$, respectively. The output signal $B_0$ comprises the RTZ differential pair $RZB_0$ and $/RZB_0$, the output signal $B_1$ comprises the RTZ differential pair $RZB_1$ and $/RZB_1$, and so on.

Continuing the running example, the phase detector 500 comprises seven phase detecting units $510_0$, $510_1$, $510_2$, $510_3$, $510_4$, $510_5$ and $510_6$.

Each phase detecting unit corresponds with a pair of the set of data receivers $410_0$ to $410_7$. For example, phase detecting unit $510_4$ corresponds with the pair of data receivers $410_0$ and $410_1$, phase detecting unit $510_5$ corresponds with the pair of data receivers $410_1$ and $410_2$, phase detecting unit $510_6$ corresponds with the pair of data receivers $410_2$ and $410_3$, and so on. In the running example, there is no phase detecting unit provided for the pair of data receivers $410_3$ and $410_4$, however this is an optional implementation detail. In the running example, the measurement clock signals $CLKM_3$ and $CLKM_4$ with which data receivers $410_3$ and $410_4$ correspond have phases at opposite ends of a given range of phases covered by the set of measurement clock signals, and so this particular combination of data receivers need not be considered. Further, each phase detecting unit receives one signal from each differential pair of signals output from its pair of data receivers, as will become apparent.

Figure 4A:
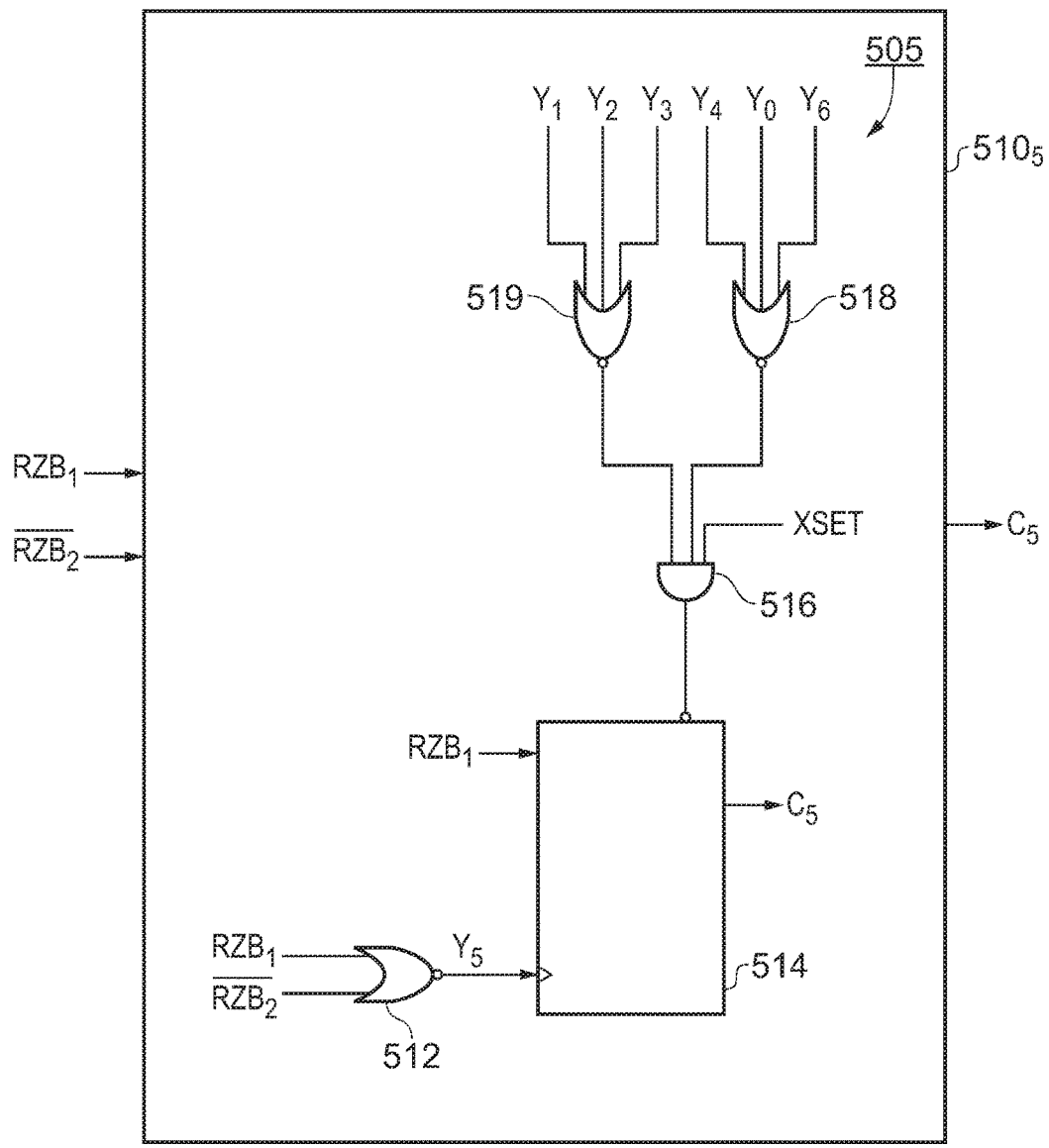
FIG. 4A is schematic diagram of a phase detecting unit which may form part of the phase detector of FIG. 1.

FIG. 4A is a schematic diagram representative of a phase detecting unit $510_5$ of the phase detector 500, being an example one of the seven phase detecting units.

The phase detecting unit $510_5$ is shown in FIG. 4A in both "black box" form, simply indicating the inputs and output so that its overall function may be understood, and also in detailed form, indicating an example of circuitry 505 which is configured to perform the overall function.

The phase detecting unit $510_5$ corresponds with the pair of data receivers $410_1$ and $410_2$ as mentioned above. The phase detecting unit $510_5$ receives the signals $RZB_1$ output from data receiver $410_1$ and $/RZB_2$ output from data receiver $410_2$, i.e. one signal from each differential pair of signals output from its pair of data receivers. The phase detecting unit $510_5$ also receives as inputs intermediate signals $Y_0$, $Y_1$, $Y_2$, $Y_3$, $Y_4$ and $Y_6$ generated in the circuitry of the other phase detecting units of the phase detector 500. These signals correspond to intermediate signal $Y_5$ which is generated in the phase detecting unit $510_5$ and is described in more detail below. The phase detecting unit $510_5$ outputs detection signal $C_5$, which is described in more detail below.

For the purpose of FIG. 4A, it is assumed that the signals $RZB_1$ and $/RZB_2$ are return-to-one signals, rather than return-to-zero signals in line with FIG. 3. This could be achieved by removing the output inverters 64 and 66 in FIG. 2, for example.

The circuitry 505 shown in FIG. 4 comprises NOR gate 512, a flip flop 514 (effectively a D-type flip flop, and being an example of an edge-triggered latch), AND gate 516 and NOR gates 518 and 519.

NOR gate 512 receives as its input the signals $RZB_1$ and $/RZB_2$, and outputs intermediate signal $Y_5$ to the flip flop 514. The flip flop 514 receives the intermediate signal $Y_5$ as its clock input, and is driven by the signal $RZB_1$.

The intermediate signals $Y_4$, $Y_0$ and $Y_6$ generated in the circuitry of other phase detecting units are input to NOR gate 518, and similarly the intermediate signals $Y_1$, $Y_2$ and $Y_3$ are input to NOR gate 519. The outputs of NOR gates 518 and 519 are input to AND gate 516. AND gate 516 also receives as an input a signal XSET.

The output of AND gate 516 is input to the reset of flip flop 514. Flip flop 514 outputs detection signal $C_5$.

FIG. 4B is a table useful for understanding how the set of phase detecting units $510_0$ to $510_6$ are connected in the running example. The phase detecting units $510_0$ to $510_6$ are identical to one another, except that they are connected to receive different combinations of input signals and output different output signals as indicated in the table. The details in the table for the phase detecting unit $510_5$ correspond to those shown in FIG. 4A, and thus the connectivity of the other phase detecting units will be understood accordingly.

Figure 5A:
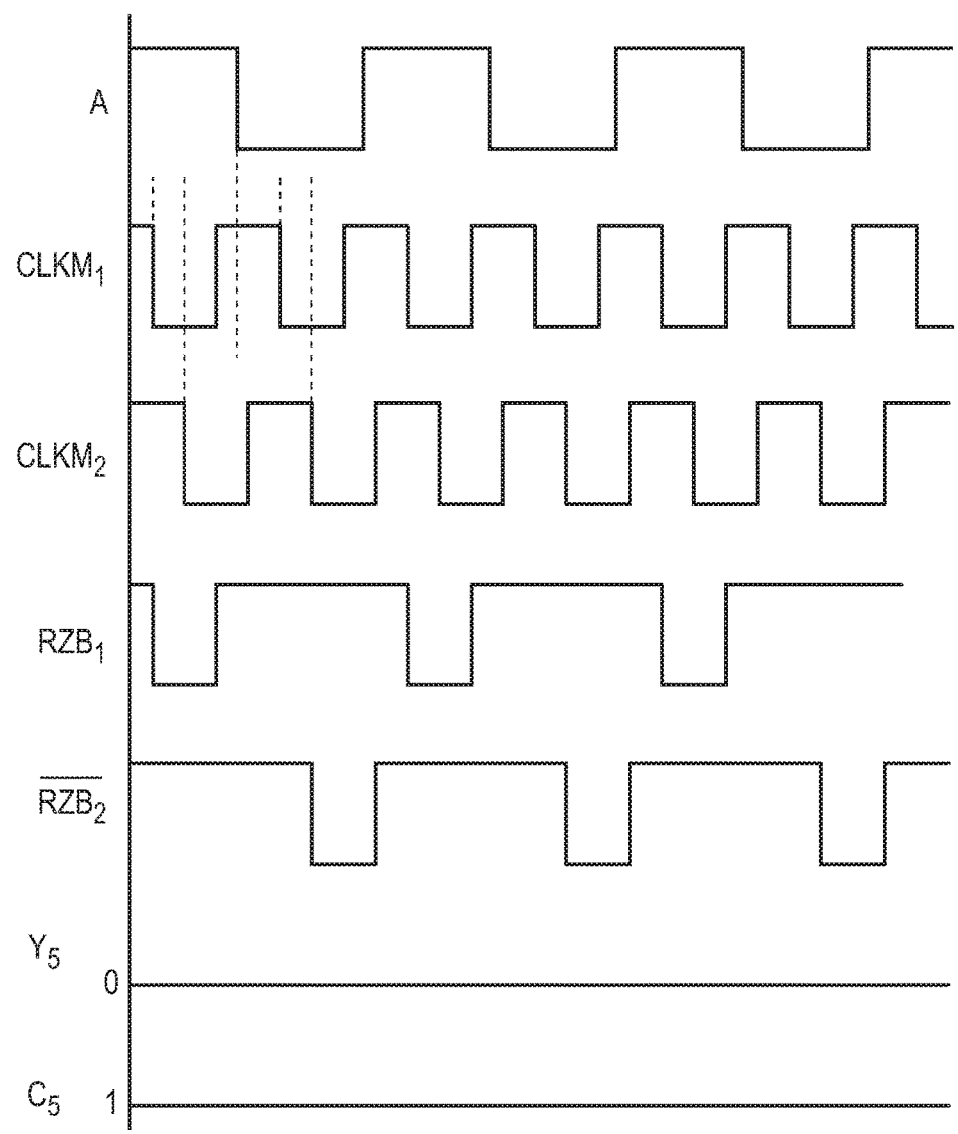
FIGS. 5A and 5B are signal timing diagrams useful for understanding the operation of the circuitry of FIGS. 2 and 4A.
Figure 5B:
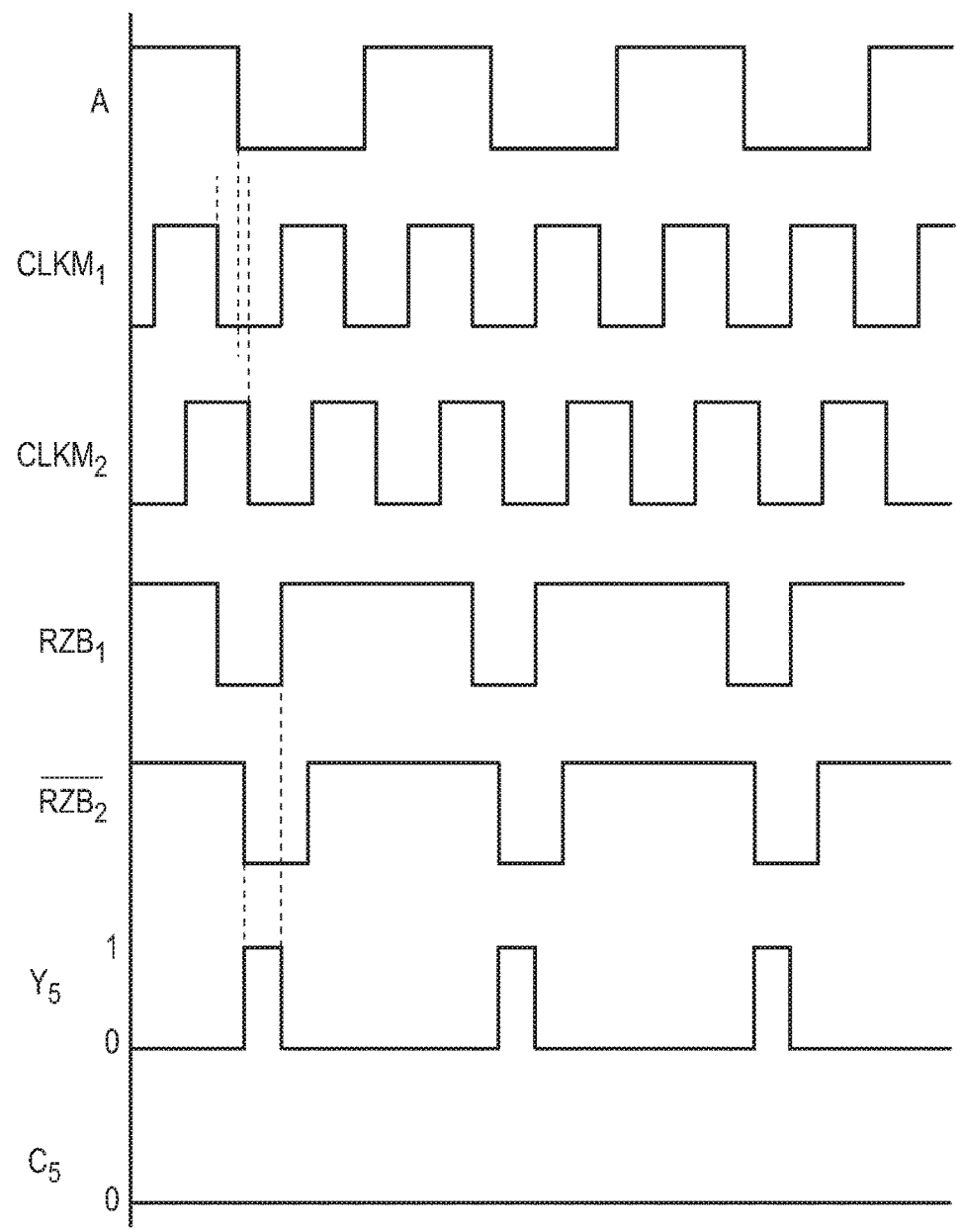

FIGS. 5A and 5B are signal timing diagrams useful for understanding the operation of the circuitry 505, continuing with a focus on phase detecting unit $510_5$ for ease of comparison with FIG. 4A.

As mentioned above, $RZB_1$ and $/RZB_2$ are provided as return-to-one signals for the purpose of FIG. 4A. It is also assumed that the data receivers $410_1$ and $410_2$ use the falling edge of their respective measurement clock signals $CLKM_1$ and $CLKM_2$ to generate the signals $RZB_1$ and $/RZB_2$.

Recall that in the running example the measurement clock signals $CLKM_1$ and $CLKM_2$ are adjacent to one another in phase, within the set of measurement clock signals $CLKM_0$ to $CLKM_7$. In this respect, note from FIG. 4B that each of the phase detecting units $510_0$ to $510_6$ is associated with a pair of data receivers which operate based on phase-adjacent measurement clock signals CLKM.

FIG. 5A illustrates a case where the falling edge of the data signal A is not between a falling edge of measurement clock signal $CLKM_1$ and a corresponding falling edge of measurement clock signal $CLKM_2$. Therefore there is no overlap between the pulses of signals $RZB_1$ (which contains a pulse when data signal A is high at the falling edge of measurement clock signal $CLKM_1$) and $/RZB_2$ (which contains a pulse when data signal A is low at the falling edge of measurement clock signal $CLKM_2$). As such, intermediate signal $Y_5$ output from NOR gate 512 remains logic zero, or low. The flip flop 514 receives intermediate signal $Y_5$ as its clock input. Therefore, when intermediate signal $Y_5$ remains low, detection signal $C_5$ remains high, as indicated in FIG. 5A. That the intermediate signal $Y_5$ remains low and the detection signal $C_5$ remains high in FIG. 5A is indicative that the phase detecting unit $510_5$ has not detected the falling edge of the data signal A as being between a falling edge of measurement clock signal $CLKM_1$ and a corresponding falling edge of measurement clock signal $CLKM_2$.

FIG. 5B illustrates a case where the falling edge of the data signal A is between a falling edge of measurement clock signal $CLKM_1$ and a corresponding falling edge of measurement clock signal $CLKM_2$. Therefore there is an overlap between the pulses of signals $RZB_1$ (which contains a pulse when data signal A is high at the falling edge of measurement clock signal $CLKM_1$) and $/RZB_2$ (which contains a pulse when data signal A is low at the falling edge of measurement clock signal $CLKM_2$). When there is overlap, intermediate signal $Y_5$ output from the NOR gate is logic 1, or high, such that intermediate signal $Y_5$ exhibits logic 1 (or high) pulses as shown.

When intermediate signal $Y_5$ is high in a pulse, the detection signal $C_5$ output from flip flop 514 goes (or remains) low, since intermediate signal $Y_5$ clocks the flip flop 514 and the signal $RZB_1$ which drives flip flop 514 is low at that time (i.e. it is pulsing at that time), as indicated in FIG. 5B. In place of the signal $RZB_1$, the signal $/RZB_2$ could be used to drive flip flop 514 for similar reasons. Further, any signal which has logic data value 0 (i.e. low) could be used, since the function is to cause the output of the flip flop 514 to go (or remain) low.

That the intermediate signal $Y_5$ exhibits high (logic 1) pulses and the detection signal $C_5$ goes or remains low in FIG. 5B is indicative that the phase detecting unit $510_5$ has detected the falling edge of the data signal A as being between a falling edge of measurement clock signal $CLKM_1$ and a corresponding falling edge of measurement clock signal $CLKM_2$.

NOR gates 518 and 519 pass their output to the AND gate 516 such that if any of the intermediate signals $Y_0$, $Y_1$, $Y_2$, $Y_3$, $Y_4$ and $Y_6$ generated in the circuitry of the other phase detecting units goes high (i.e. exhibits a logic 1 pulse, indicating that the phase detecting unit 510 concerned has detected a falling edge of the data signal A), the output of flip flop 514 is reset and the detection signal $C_5$ goes high. The XSET signal (e.g. a software-controlled reset signal) is also input to the AND gate 516 and can be used to reset the output of the flip flop 514 to high, e.g. on start-up.

The phases of the time-interleaved measurement clock signals CLKM input to the data receivers $410_0$ to $410_7$ may be spread across 360°. They may, for example, be spread evenly across this range. Since the measurement clock signals in this example are twice the frequency of the transmission clock signal CLKT as mentioned above, this spread of phases covers half of one period of the data signal A, and a single falling edge of the data signal A is included in this range. Thus, a falling edge of the data signal A occurs between falling edges of measurement clock signals corresponding to just one pair of data receivers, and so corresponding to a single phase detecting unit.

By the configuration of the circuitry 505 described above, the detection signal C of only one phase detector is low at any time, and the rest are high. Therefore the position of a falling edge of the data signal can be determined relative to the phases of the measurement clock signals, as being between falling edges of one pair of measurement clock signals CLKM. Note that in FIGS. 5A and 5B, the detection signal $C_5$ is held either low or high (i.e. effectively giving a stable or DC output), which enables the detection of whether or not an edge has been detected to be readily read.

The phases of the time-interleaved measurement clock signals may be spread across another range. This range may be chosen such that it is reasonably likely that a falling edge of the data signal A will occur within this range, and so the phase of the data signal A can be measured relative to the phases of the measurement clock signals.

Although in the above example the phase detecting unit $510_5$ receives the signals $RZB_1$ output from data receiver $410_1$ and $/RZB_2$ output from data receiver $410_2$, the phase detecting unit $510_5$ could instead receive as its input the signals $RZB_2$ output from data receiver $410_2$ and $/RZB_1$ output from data receiver $410_1$. The input signals should be the "positive" signal (e.g. $RZB_2$) from one of the data receivers of the pair and the "negative" signal (e.g. $/RZB_1$) from the other one of the data receivers so that an edge can be detected.

Although the example above was described using return-to-one signals input to the phase detector 500, it will be appreciated that return-to-zero signals could also be used with minimal modification to circuitry of the phase detector 500 (for example, by using AND gates in place of NOR gates where appropriate).

Further, although in the example above the phase detector 500 detected the position (relative to the time-interleaved measurement clock signals CLKM) of a falling edge of the data signal A, the circuitry could also be configured, with minimal modification, to detect the position of a rising edge of the data signal A (for example, in the phase detector $510_5$, $RZB_2$ and $/RZB_1$ could be used in place of $RZB_1$ and $/RZB_2$ and so on).

It will be appreciated that there could be more or fewer data receivers and phase detecting units, this effectively determining the resolution or accuracy of the edge detection. It will also be appreciated that the phase detecting units could be configured to correspond with pairs of the set of data receivers in different ways.

The output signal C from the phase detector 500 may comprise the detection signal of each phase detection unit of the phase detector 500. Such an output signal C may be input directly to the phase rotator 6, which may be equipped with circuitry for reading such a signal so that the phase rotator 6 can adjust a phase of the transmission clock signal CLKT accordingly. Alternatively, the detection signals $C_0$ to $C_6$ output from the phase detection units $510_0$ to $510_6$ may be input to rotation-logic circuitry (not shown) which may be included in the phase detector 500. In this case, the rotation-logic circuitry is configured to receive the detection signals $C_0$ to $C_6$, process them, and output the output signal C to the phase rotator 6 in the form of control bits. Specifically, the control signal C may comprise a "change" control bit and a "direction" control bit. These control bits are described in more detail below.

The rotation-logic circuitry may, for example, be configured so that it reads the detection signals $C_0$ to $C_6$ as an array of logic data values, for example as 1101111, and outputs control bits so that the phase of the transmission clock signal CLKT is adjusted to cause the single logic data value 0 of the array (or the single logic data value 1, as the case may be) to move towards, and remain at, a particular position relative to the array, for example to maintain the array 1110111, according to a target phase. For example, the target phase of the transmission clock signal CLKT may be such that a particular one of the data receivers latches the data signal A directly (i.e. halfway) between a rising and falling edge of the data signal A.

Returning to FIG. 1, the data transmitter 2, signal line L and one of the data receivers $410_0$ to $410_7$ of the control unit 400 may be considered to constitute a first data channel of the multiplexer circuitry 1000, and the multiplexer circuitry 1000 may comprise further such data channels. In this case, the data transmitter 2 of each further data channel is operable according to a corresponding transmission clock signal CLKT.

The transmission clock signals CLKT of the further data channels may be held in a given phase relationship with the transmission clock signal CLKT of the first data channel, so that when the phase of the transmission clock signal CLKT of the first data channel is adjusted so are the phases of the transmission clock signals CLKT of the further data channels. That is, the transmission clock signals CLKT may be time-interleaved clocks signals of a multiphase clock signal. The data receiver 410 of each further data channel is operable according to a corresponding reception clock signal. The reception clock signals of the further data channels are held in a given phase relationship with the measurement clock signal CLKM of the first data channel. There may be just one further data channel, in a particular implementation. The data signals carried by the further data channels may carry actual data, in contrast to the "dummy" data signal of the first data channel which simply alternates between logic 1 and logic 0. Thus, the first data channel may be considered a "dummy" data channel and the further such data channels may be considered "real" or "actual" data channels.

Figure 6:
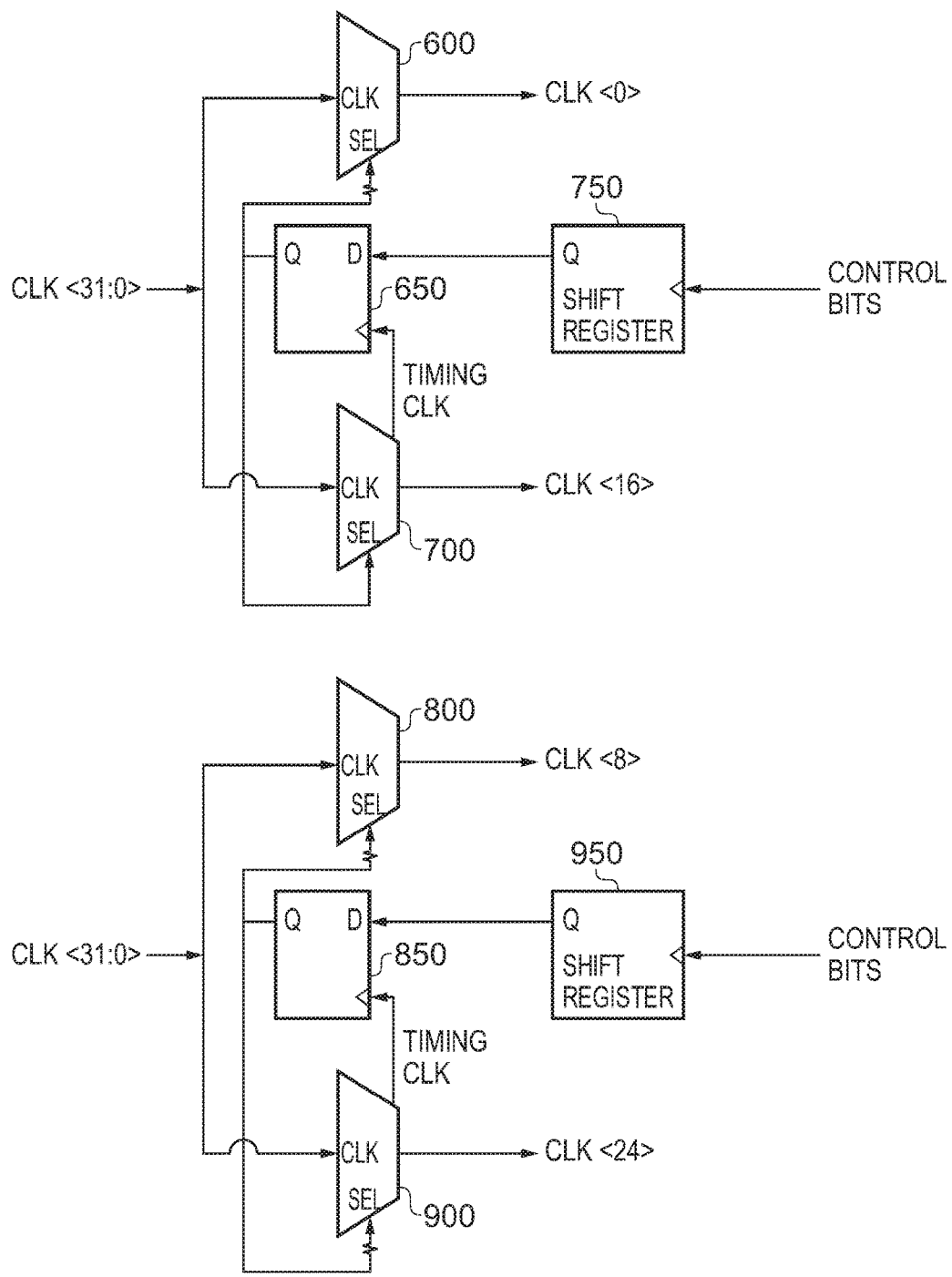
FIG. 6 is a schematic diagram of the phase rotator of FIG. 1.

FIG. 6 is a schematic diagram showing an example implementation of the phase rotator 6.

The phase rotator 6 shown in FIG. 6 comprises phase selectors 600, 700, 800 and 900, shift registers 750 and 950 and flip flops 650 and 850, the flip flops 650 and 850 being examples of edge-triggered latches.

Each of the phase selectors outputs a transmission clock signal to be supplied to one of the data channels. Each phase selector may also output a timing clock signal related to its transmission clock signal as will become apparent (this is shown for phase selectors 700 and 900 in FIG. 6). In this particular example there are four data channels and so there are four phase selectors. Where the transmission clock signals are required to have a set phase relationship with one another, the phase selectors 600, 700, 800 and 900 can be connected with common shift registers 750 and 950 and flip flops 650 and 850, or even with a single shift register and a single flip flop. In this particular example, phase selectors 600 and 700 are connected with common shift register 750 and flip flop 650, and phase selectors 800 and 900 are connected with common shift register 950 and flip flop 850.

Each of the phase selectors 600, 700, 800 and 900 is supplied with a 32-phase time-interleaved clock signal (denoted by CLK<31:0>) in this example. The phase selectors 600 and 700 are controlled by flip flop 650, and the phase selectors 800 and 900 are controlled by flip flop 850. The flip flop 650 receives as its clock input the clock signal output from phase selector 700, and also receives a signal output from shift register 750. The flip flop 850 receives as its clock input the clock signal output from phase selector 900, and also receives a signal output from shift register 950. The shift registers 750 and 950 receive the control signal C output from phase detector 500, provided as control bits.

The signals output from flip flops 650 and 850 are latched according to the clock signal each flip flop receives, and then input into phase selectors 600, 700, 800 and 900, as will be described in more detail below.

Figure 7:
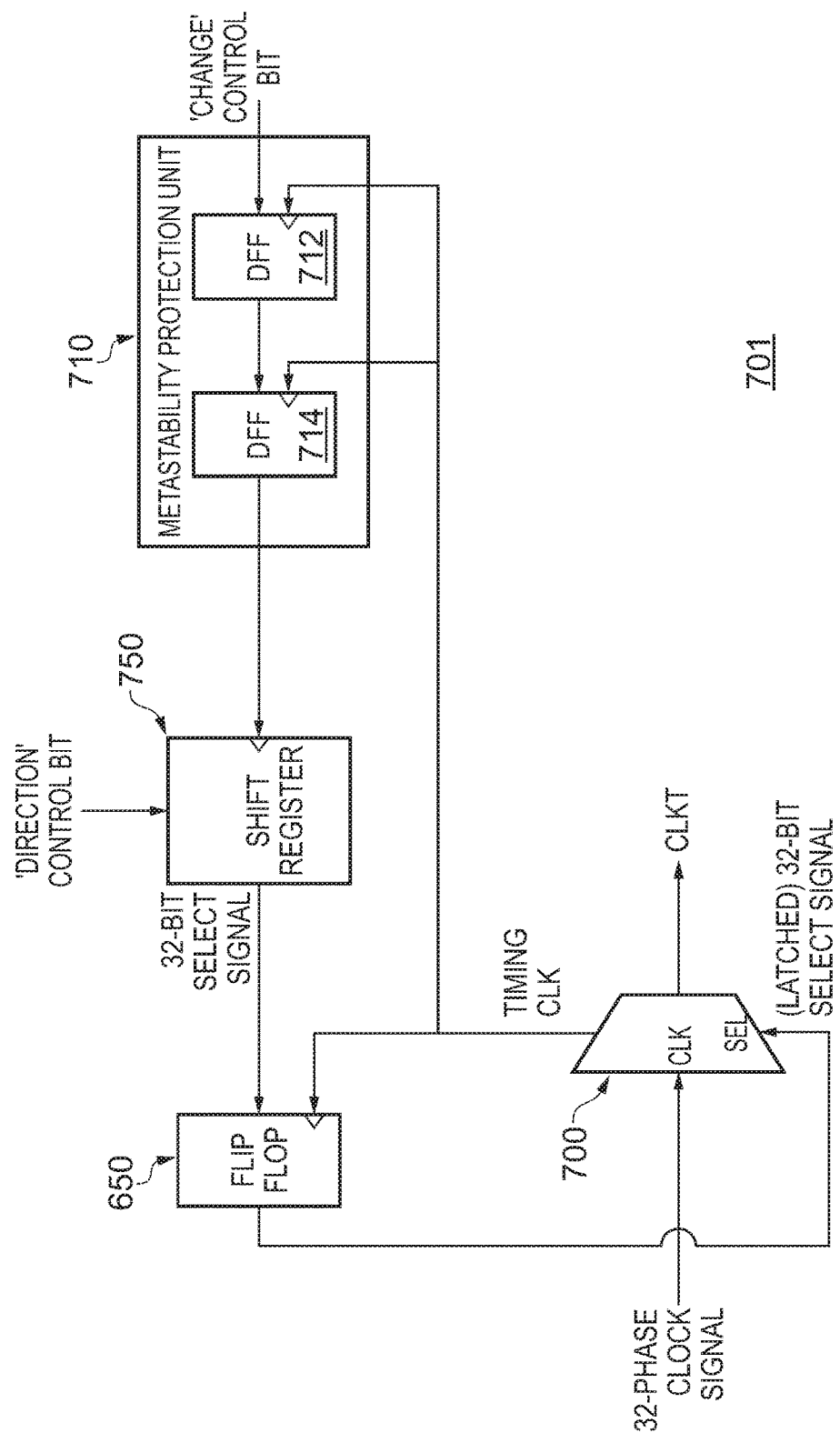
FIG. 7 is a schematic diagram of a phase selector system.

FIG. 7 is a schematic diagram of a phase selector system 701, useful for understanding one way in which the circuitry of FIG. 6 may be configured to operate.

Phase selector system 701 comprises the phase selector 700, the shift register 750 and the flip flop 650 of FIG. 6, and in addition a metastability protection unit 710. The metastability protection unit 710 comprises D-type flip-flops (DFFs) 712 and 714 (being examples of edge-triggered latches).

It will be understood that the phase selector 900, the shift register 950 and the flip flop 850 of FIG. 6 form part of another such phase selector system which has a corresponding metastability protection unit, though this is not shown here for simplicity. The operation of such a further phase selector system corresponds to the operation of the phase selector system 701.

Shift register 750 is a bi-directional shift register, and is enabled with a number of outputs, one of which outputs logic value 1 (or high), and the rest of which output logic value 0 (or low). The single bit with logic value 1 (i.e. the output that outputs logic value 1) may be moved "up" and "down" by toggling. In this particular example, there are 32 possible phases from which to select a single phase for the transmission clock signal for each data channel. Therefore, shift register 750 has 32 outputs. The 32 signals output from shift register 750 make up a 32-bit select signal output from the shift register 750, which is latched by flip flop 650 and input to phase selector 700. This causes the output of the phase selector 700 to move phase-by-phase, in either direction. Shift register 750 is controlled by two control bits as may be output from the phase detector 500, as mentioned previously. A "direction" control bit sets the direction in which the bit with logic value 1 should move ("up" or "down"), and consequently, whether a clock signal with a phase before or after the phase of the clock signal presently output from phase selector 700 is required. A "change" control bit causes shift register 750 to toggle once.

Shift register 750 receives the "change" control bit from the phase detector 500 via the metastability protection unit 710. The "change" control bit is input from phase detector 500 to DFF 712 of the metastability protection unit 710. DFFs 712 and 714 receive a (single-phase) timing clock output from the phase selector 700. DFF 712 latches the "change" control bit according to the timing clock signal received from phase selector 700 and outputs the latched data to DFF 714, which latches the data again according to the timing clock signal received from phase selector 700. DFF 714 outputs the double-latched control bit to the shift register 750.

The 32-bit select signal output from shift register 750 is latched by flip flop 650 according to the timing clock signal output from phase selector 700, which is also received by the metastability protection unit 710. The latched 32-bit select signal is output from flip flop 650 and received by phase selector 700. Phase selector 700 also receives a 32-phase clock signal as already mentioned. This consists of 32 time-interleaved clock signals with different relative phases to each other.

The 32-phase clock signal is received from any suitable clock generator, which may also generate the measurement clock signals supplied to the control unit 4. Such a clock generator may also generate the reception clock signals supplied to the further data channels. As an example, mentioned previously, the clock signals output from the phase selectors 600, 700, 800 and 900 in FIG. 6 may be passed via a clock divider (divide-by-two) such that the measurement clock signals have twice the frequency of the transmission clock signals as mentioned above.

The phase selector 700 outputs a single-phase clock signal from among the 32 candidate time-interleaved clock signals of the 32-phase clock signal input to the phase selector 700. Example circuitry for performing the function of selecting a single-phase clock signal will be described below with reference to FIG. 9.

Figure 8A:
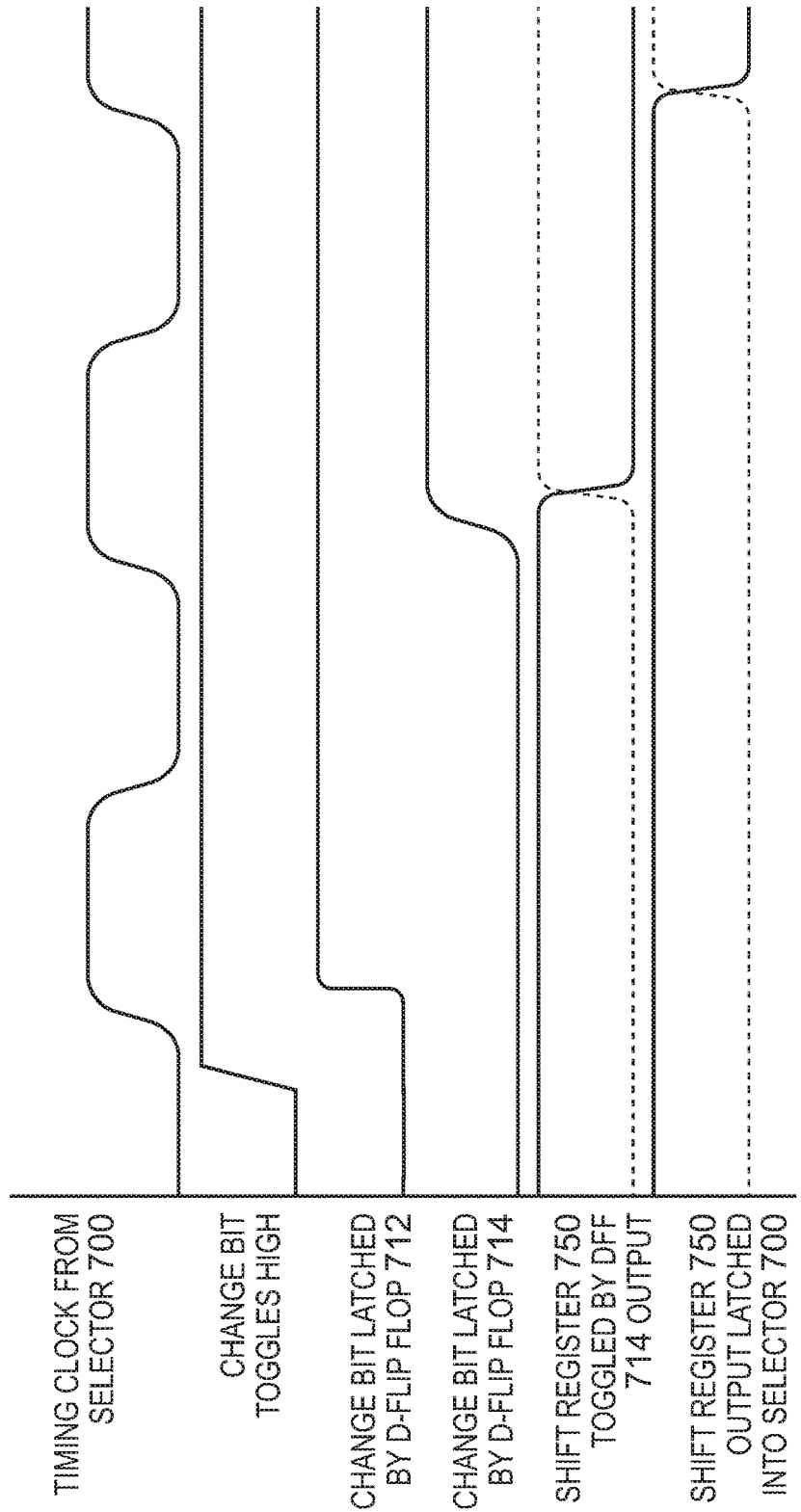
FIGS. 8A to 8D are signal timing diagrams useful for understanding the phase selector system of FIG. 7.

FIG. 8A is a signal timing diagram illustrating the function of the phase selector system 701.

The purpose of the metastability protection unit 710 is to avoid metastability which would otherwise be caused by the "change" control bit being received by the shift register 750 when the 32-bit select signal output from the shift register 750 is being latched by flip flop 650. Since DFFs 712 and 714 are controlled by the same timing clock, any metastability that might occur at DFF 712 when the "change" control bit is first latched has one cycle of the timing clock to settle. Therefore the latching at DFF 714 is always decisive (i.e. no metastability will occur). DFFs 712 and 714 and flip flop 650 are controlled by the same timing clock. The delay through the shift register 750 is sufficient such that the 32-bit select signal output from the shift register 750 will not be latched at the same time as the double-latched "change" control bit is received by the shift register 750 (i.e. as shift register 750 toggles).

Figure 8B:
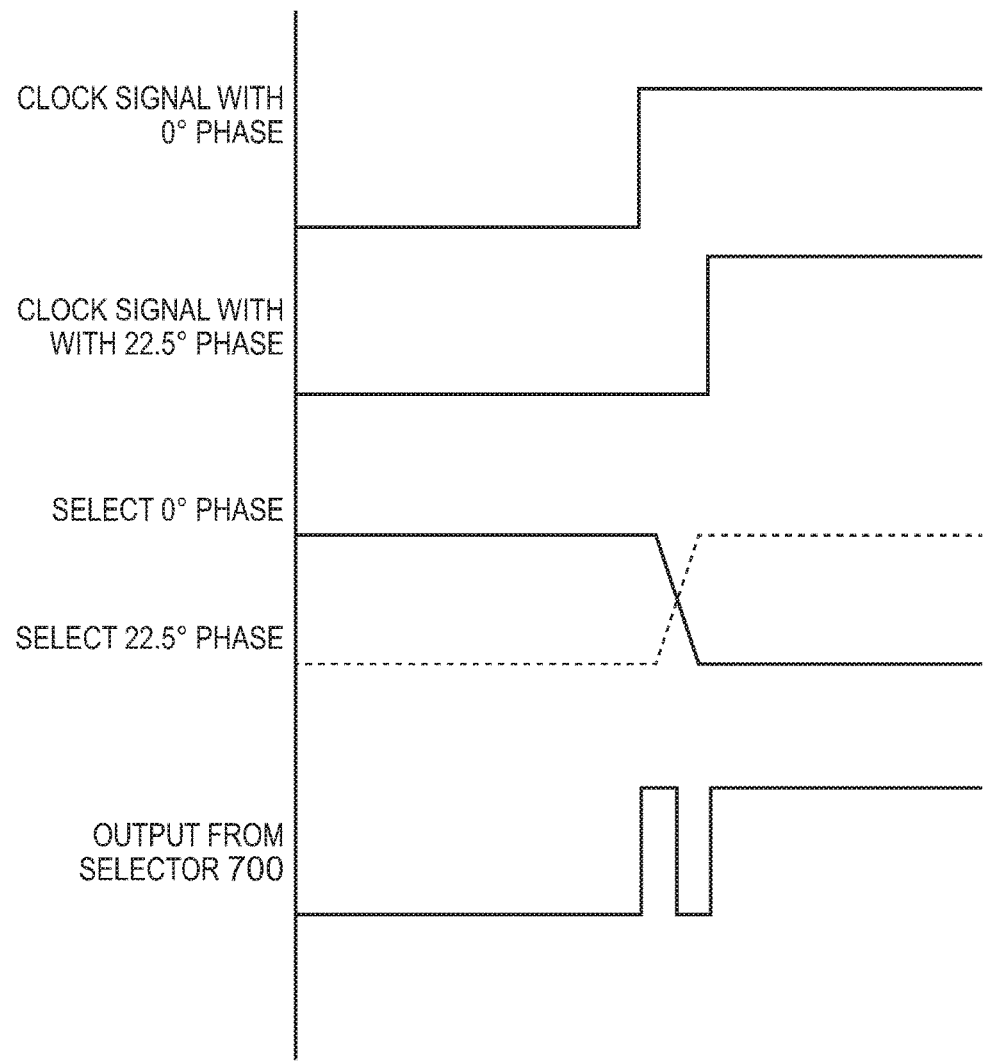

The 32-bit select signal output from shift register 750 is latched by flip flop 650 so that the phase selector 700 does not receive the 32-bit select signal at the same time as the phase selector 700 is changing its output. If the phase selector 700 received the 32-bit select signal as it was changing its output, a glitch would occur. Such a glitch is illustrated in FIG. 8B. This situation is avoided by using the timing clock output from the phase selector 700 to control the flip flop 650.

Figure 8C:
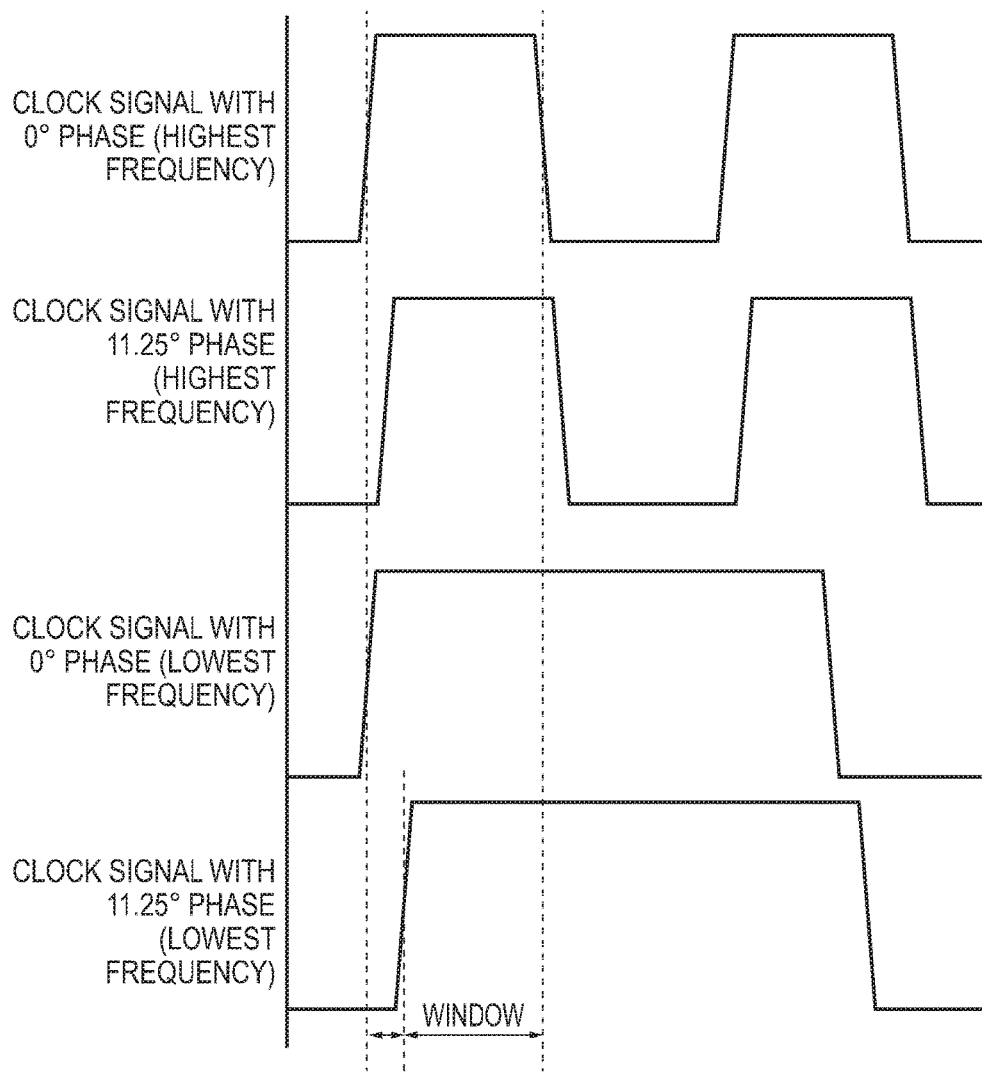

There is also a restriction in the present example on the range of available frequencies that the clock signals may have, and on the relative phase difference of adjacent clock signals of the 32-phase clock signal. In detail, to ensure no glitch occurs, the frequency range and phase difference are selected such that the delay through the phase selector 700 and the flip flop 650 is less than a half-period of the timing clock at the highest frequency of the frequency range, and more than the time between adjacent phases of the 32-phase clock signal at the lowest frequency of the frequency range. This suitable window is illustrated in FIG. 8C. If frequencies are used outside this window, or if the phases of the 32-phase clock signal are used such that the time between adjacent phases is outside this window, there is no guarantee that a glitch in the phase selector 700 will not occur.

Figure 8D:
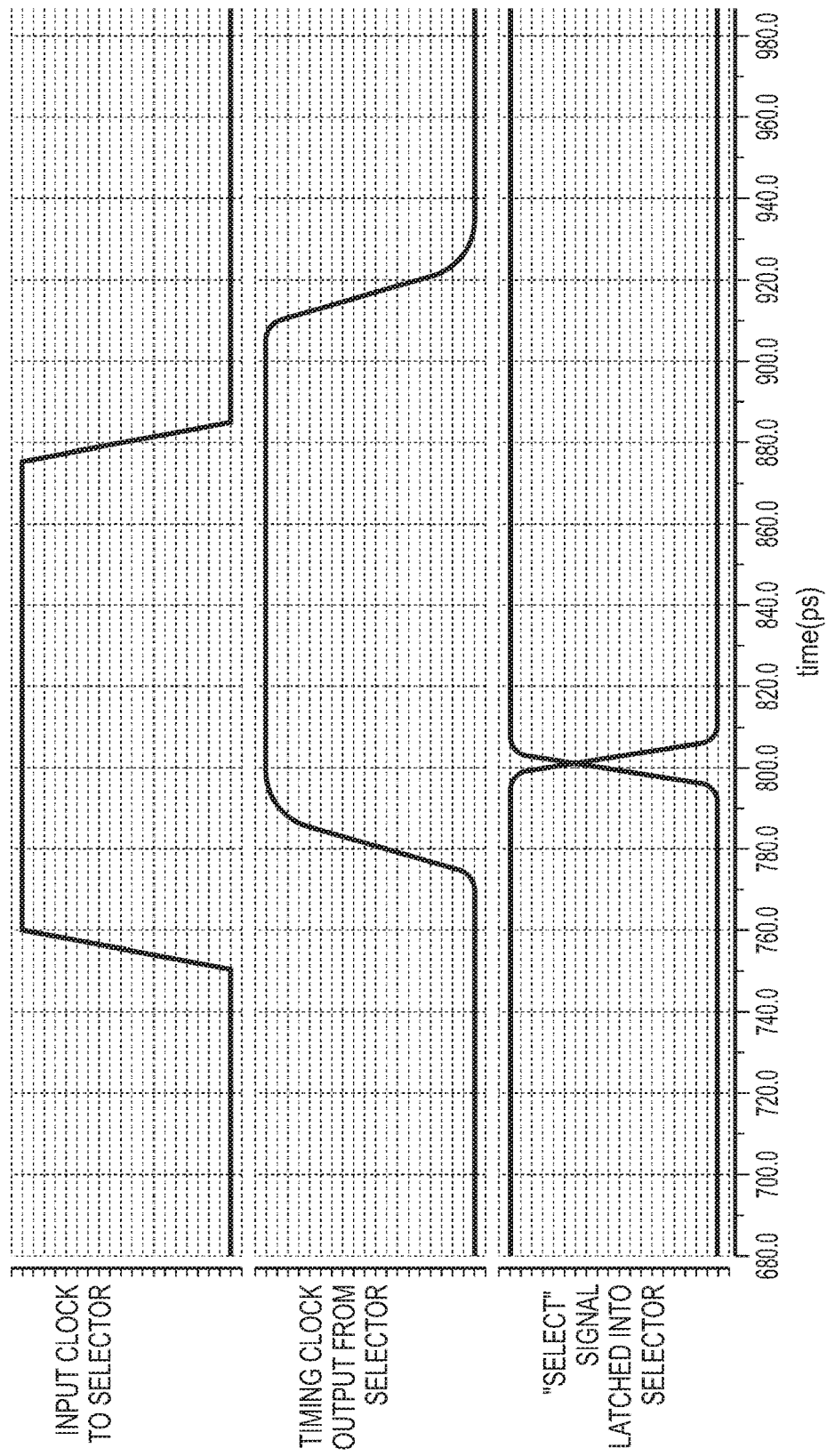

FIG. 8D is a signal timing diagram illustrating the toggling of the phase selector 700 when the frequency of the clock signals and the relative phases fall within the "glitch-free" window, and is effectively an enlarged portion of FIG. 8A. It can be appreciated from FIG. 8D that the phase selector 700 changes its clock output within the window.

Figure 9:
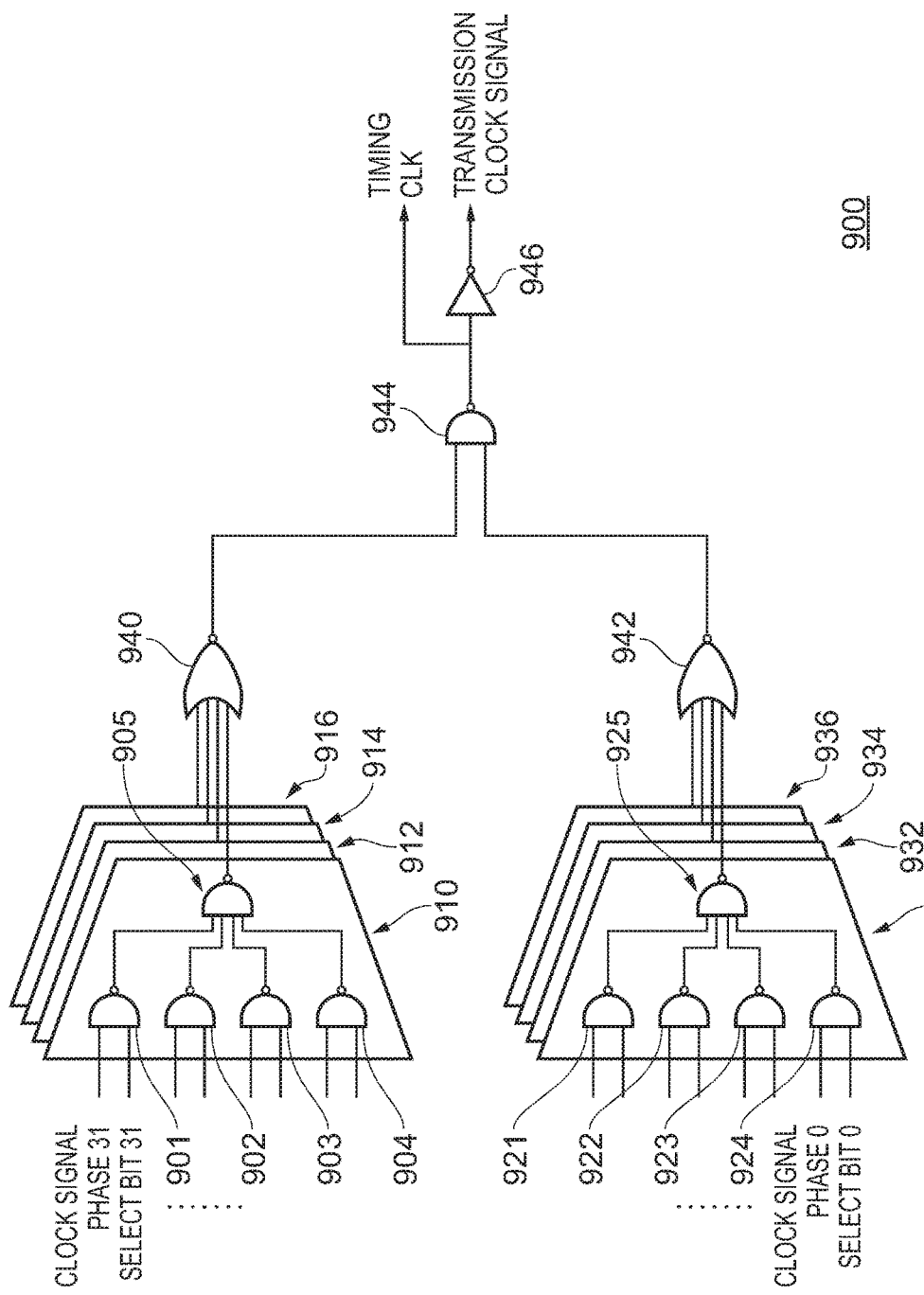
FIG. 9 is a schematic diagram of one of the phase selectors of FIG. 6.

FIG. 9 is a schematic diagram representative of one of the phase selectors of FIG. 6, in this case phase selector 900.

Phase selector 900 comprises receiving units 910, 912, 914, 916, 930, 932, 934 and 936, NOR gates 940 and 942, NAND gate 944 and inverter 946. The receiving units each comprise four first-stage NAND gates and one second-stage NAND gate. These are illustrated only for receiving units 910 and 930, for simplicity.

The 32-bit select signal input to the phase selector 900 is provided as 32 single-bit select signals, and the 32-phase clock signal input to the phase selector 900 is provided as 32 candidate time-interleaved clock signals with different relative phases to each other. Each first-stage NAND gate within the receiving units 910, 912, 914, 916, 930, 932, 934 and 936 (e.g. NAND gates 901-904 of receiving unit 910 and NAND gates 921-924 of receiving unit 930) receives one of the 32 single-bit select signals and a corresponding one of the 32 clock signals, so that each single-bit select signal is associated with a clock signal. The outputs of the first-stage NAND gates are input to the second-stage NAND gate in each receiving unit (e.g. to NAND gate 905 in receiving unit 910 and to NAND gate 925 in receiving unit 930). The outputs of the second-stage NAND gates of receiving units 910, 912, 914 and 916 are input to NOR gate 940 and the outputs of the second-stage NAND gates of receiving units 930, 932, 934 and 936 are input to NOR gate 942. The outputs of NOR gates 940 and 942 are input to NAND gate 944. The output of NAND gate 944 is input to inverter 946. The output of the inverter is to be provided to a data transmitter of one of the data channels.

The output of NAND gate 944 is also to be provided as the timing clock signal to the metastability protection unit associated with the phase selector 900 and to the flip flop 850.

It will already be apparent that a single bit among the 32 single-bit select signals will have a logic value 1, and the rest will have a logic value 0. Through the operation of the logic gates configured as described above, the single bit with logic value 1 will carry through its associated clock signal to the output of the phase selector.

It will be appreciated that the cascading logic gate structure could be implemented using various configurations of logic gates, and the configuration described above is one particular example. An advantage of the configuration described above is that the signal length, number of logic gates and delay can be the same for each clock signal, so that there is no delay implication relating to adjusting which clock phase is selected.

As mentioned above, where transmission clock signals are required to have a set phase relationship, circuitry can be shared between the phase selectors 600, 700, 800 and 900. For the selectors to output different clock signals, they may simply be connected with the shift register differently. For example, in the example described above, select bit 0 of the 32-bit select signal may correspond with clock phase <0> in phase selector 700, and the select bit 0 of the 32-bit select signal may correspond with clock phase <16> in phase selector 600. Therefore when select bit 16 is the single bit with logic value 1 in the 32-bit select signal, clock phase <16> is selected by phase selector 700, and clock phase <0> is selected by phase selector 600. Phase selectors 800 and 900 are similarly connected with the corresponding shift register 950.

It will be appreciated that phase selectors may be connected differently with the shift registers. In particular, circuitry may not necessarily be shared between phase selectors and shift registers.

By the above configuration of multiplexer circuitry 1000, the phase of the data signal A can be measured relative to a measurement clock signal, and the phase of a clock signal can be adjusted.

Figure 10:
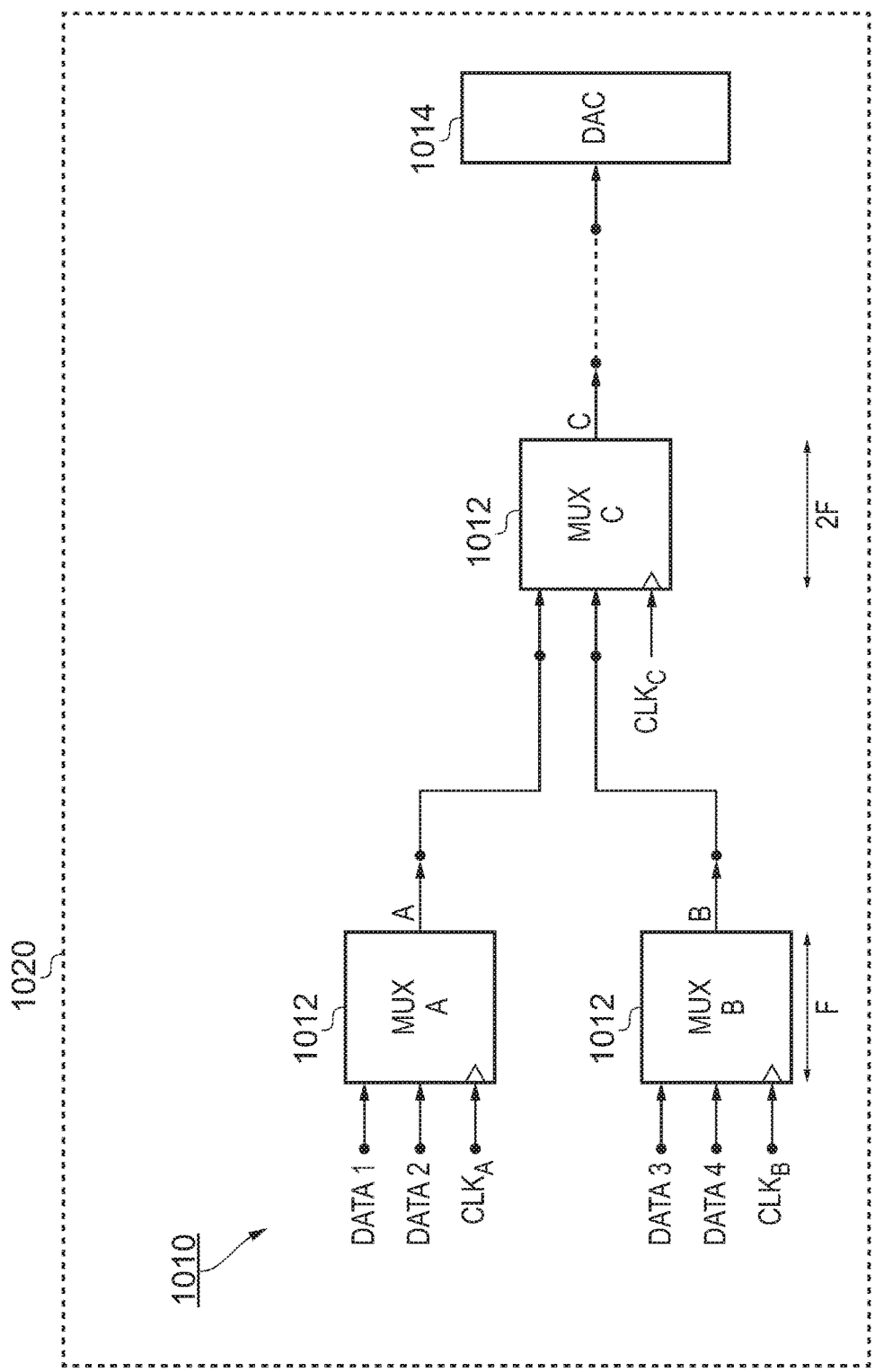
FIG. 10 is a schematic diagram of a multiplexer system which may comprise the multiplexer circuitry of FIG. 1.

FIG. 10 is a schematic diagram of a multiplexer system 1010 useful for understanding the general environment in which embodiments of the present invention may be used.

Multiplexer system 1010 comprises a plurality of multiplexers 1012 and a DAC circuit block 1014. It will be appreciated that the DAC circuit block 1014 is just one example circuit block which may operate based on an input data signal supplied from a multiplexer. Embodiments of the present invention may of course be used in conjunction with any circuitry employing data signals.

It will also be appreciated that the present system 1010 and various embodiments disclosed above are described in the context of multiplexing digital data signals. However, digital data signals are simply one convenient example, and the present invention may be applied to the multiplexing of information signals in general. For example, such information signals may be data or control signals, and may be digital or analogue signals. The running example above handles pairs of information signals, so that information values are expressed by differences in magnitude between the information signals of each pair, and this is also applicable in the multiplexer system 1010.

Three multiplexers 1012 are shown, labelled MUX A, MUX B and MUX C for convenience, with the understanding that they may form part of a larger multiplexer tree arrangement. In the example, multiplexers A and B are present in the same stage of the tree, with their corresponding output signals (also labelled A and B for convenience) being received by multiplexer C in the next stage.

Multiplexer A is connected to receive data (information) signals DATA1 and DATA2, and clock signal $CLK_A$. Multiplexer B is connected to receive data (information) signals DATA3 and DATA4, and clock signal $CLK_B$. Multiplexer C is connected to receive data (information) signals A and B, and clock signal $CLK_C$. Multiplexer A outputs data signal A to multiplexer C, and similarly multiplexer B outputs data signal B to multiplexer C. In turn, multiplexer C outputs data signal C.

Multiplexers A and B operate at the same speed (indicated as clock frequency F in FIG. 10), and as such clock signals $CLK_A$ and $CLK_B$ may be the same as one another or for example simply out-of-phase with one another. Multiplexer C in the next stage operates at double the speed of multiplexers A and B, and this is indicated as clock frequency 2F in FIG. 10. Clock signals $CLK_A$ and $CLK_B$ therefore have clock frequency F and clock signal $CLK_C$ has clock frequency 2F. Clock signal $CLK_C$ may be synchronised and in phase with one or both of clock signals $CLK_A$ and $CLK_B$.

Data signals (as an example of information signals) therefore pass from stage to stage of the multiplexer tree, each stage performing a parallel-to-serial multiplexing/retiming operation, so as to end up with a single input to the DAC circuit block 1014 as indicated in FIG. 1. Although not shown in FIG. 10, further multiplexer stages may precede multiplexers A and B, and further multiplexer stages may follow multiplexer C. The number of stages is of course application dependent.

Comparing FIGS. 1 and 10, it will understood thus that the multiplexer circuitry 1000 could form part of the multiplexer system 1010.

For example, the data receiver 410 in a further data channel of the running example could precede the multiplexer A 1012 and provide its input data signal DATA1. Similarly, other data receivers 410 of other further channels could provide DATA2, DATA3, and DATA4.

As another example, the data transmitter 2 and the data receiver 410 in a further data channel of the running example could serve as the multiplexer A 1012 and the multiplexer C, respectively. Similarly, the data transmitter 2 and the data receiver 410 in another further data channel of the running example could serve as the multiplexer A 1012 and the multiplexer C, respectively. In this case, the two data receivers could be combined as a single data receiver with parallel inputs as disclosed in FIG. 2 of EP3217548, the entire contents of which are incorporated herein by reference.

Figure 11:
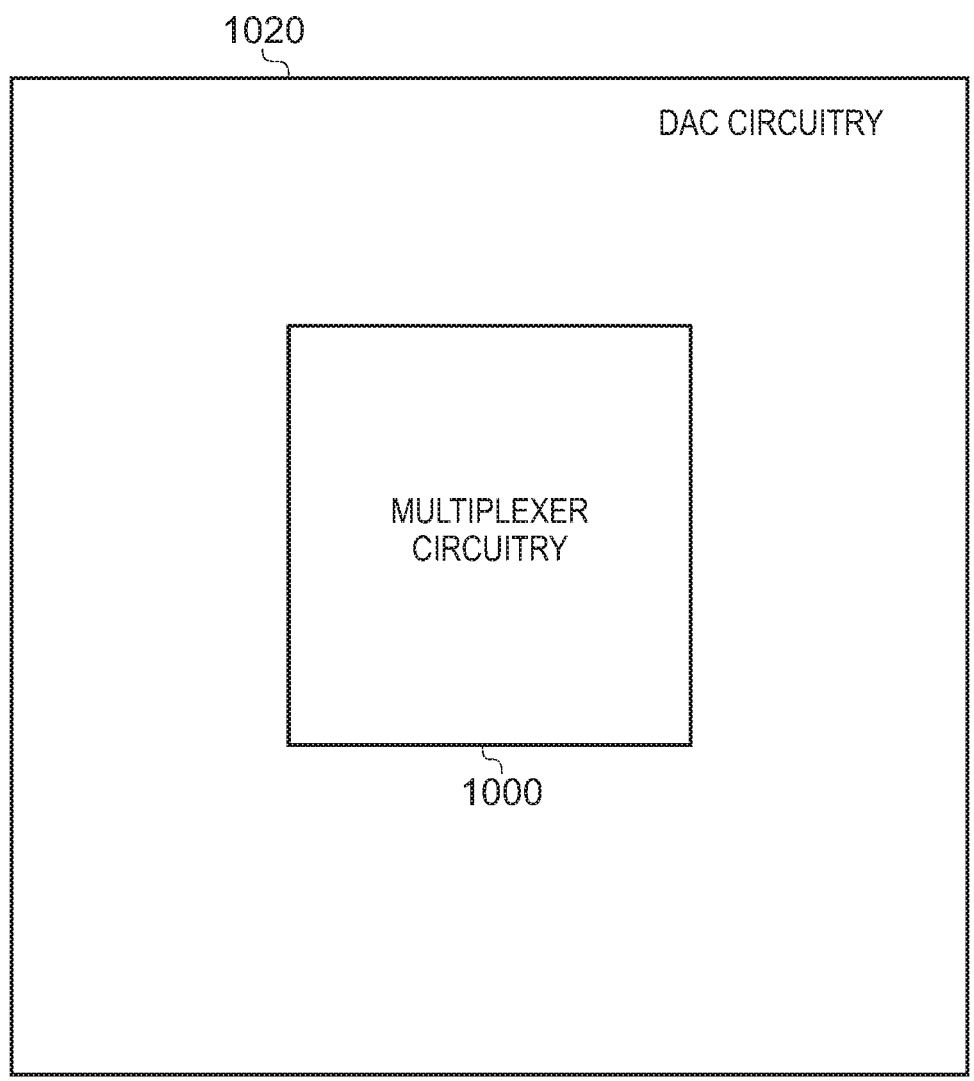
FIG. 11 is a schematic diagram of digital-to-analogue (DAC) circuitry which may comprise the multiplexer circuitry of FIG. 1.

It will therefore be appreciated that the multiplexer circuitry 1000 embodying the present invention could be provided along with mixed-signal circuitry such as DAC or ADC circuitry. For example, the multiplexer circuitry disclosed herein—provided along with DAC or ADC circuitry—could be described as a DAC 1020 (or, in another example, an ADC), as illustrated in FIG. 11. This is also indicated in FIG. 10. The multiplexer circuitry 1000 could also be provided as part of other circuitry employing data and clock signals.

Equally, it will be appreciated that the phase rotator 6, or the control unit 4, could be provided along with mixed-signal circuitry such as DAC or ADC circuitry, or other circuitry employing data and clock signals, to provide their basic functions as described above independently of the other elements of the multiplexer circuitry 1000. This could be depicted by effectively replacing the multiplexer circuitry 1000 in FIG. 11 with the phase rotator 6 or the control unit 4 of FIG. 1.

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

Further embodiments may be provided within the spirit and scope of the present invention as disclosed herein.

The invention claimed is:
1. Multiplexer circuitry, comprising:
   a data transmitter configured to transmit a data signal across a signal line based on a transmission clock signal;
   a control unit comprising a data receiver and a phase detector, wherein the data, receiver is configured to receive the data signal from the signal line based on a reception clock signal and to generate an output signal based on the received data signal and synchronized with the reception clock signal, and wherein the phase detector is configured to measure a phase of the received data signal relative to a phase of the reception clock signal based on said output signal and to output a control signal indicative of a difference between the measured phase and a target phase of the received data signal; and a phase rotator configured to adjust the phase of the transmission clock signal based on the control signal to bring the measured phase towards or to the target phase, wherein:

the output signal comprises a pulse signal having pulses synchronised with edges of the reception clock signal, each pulse indicative of a data value of the data signal at a corresponding said edge of the reception clock signal;

the control unit comprises a pair of said data receivers each configured to receive the data signal from the signal line based on a corresponding reception clock signal and to generate a corresponding said output signal;

the reception clock signals have different relative phases from one another so that the output signals have associated different relative phases from one another; and the phase detector is configured to determine that an edge of the data signal is between corresponding edges of the reception clock signals of the pair if the pulses from the data receivers of the pair which are synchronised with those edges indicate opposite data values.

2. Multiplexer circuitry as claimed in claim 1, wherein the output signal comprises;

a first pulse signal having pulses synchronised with edges of the reception clock signal at which the data signal has a logic 1 data value; or a second pulse signal having pulses synchronised with edges of the reception clock signal at which the data signal has a logic 0 data value.

3. Multiplexer circuitry as claimed in claim 1, wherein the phase detector is configured to determine that an edge of the data signal is between corresponding edges of the reception clock signals of the pair if a pulse indicating a data value 0 from one of the data receivers of the pair overlaps with a pulse indicating a data value 1 from the other one of the data receivers of the pair.

4. Multiplexer circuitry as claimed in claim 3, wherein the pulses are logic 0 pulses and the phase detector is operable to detect the overlap by performing a NOR function on the output signals of the pair.

5. Multiplexer circuitry as claimed in claim 1, wherein:

the control unit comprises a set of data receivers operable based on a corresponding set of reception clock signals, the set of reception clock signals being time-interleaved such that they have different relative phases from one another; and the set of data receivers are organised into a plurality of said pairs, the phase detector configured, for each said pair, to determine whether an edge of the data signal is between corresponding edges of the reception clock signals of the pair.

6. Multiplexer circuitry as claimed in claim 5, wherein:

the phase detector comprises a latch for each pair of data receivers; and each latch is configured, when an overlap is detected for its pair of data, receivers, to output an overlap signal, and, when an overlap is detected for another pair of data receivers, to output a non-overlap signal, optionally wherein each latch is configured to:

maintain an output overlap signal until the detection of an overlap for another pair of data receivers causes it to output a non-overlap signal; and maintain an output non-overlap signal until an overlap detected for its pair of data receivers causes it to output an overlap signal.

7. Multiplexer circuitry as claimed in claim 1, wherein the phase rotator is configured to adjust the phase of the transmission clock signal by selecting as the transmission clock signal a clock signal from among a plurality of candidate time-interleaved clock signals that are phase shifted relative to each other, optionally wherein the phase rotator comprises:

a plurality of input nodes configured to receive respective clock signals of the plurality of candidate clock signals;

an output node; and selector circuitry operable, based on the control signal, to adjust which one of the candidate clock signals is selected to be, output at the output node via a corresponding path through the selector circuitry, wherein the phase rotator is configured such that the propagation delays of the candidate clock signals between the input and output nodes when selected are the same as one another.

8. Multiplexer circuitry as claimed in claim 1, wherein:

said data transmitter, signal line, and the or a particular one of the data receivers of the control unit constitute a first data channel of the multiplexer circuitry; and the multiplexer circuitry comprises at least a further data channel, whose transmission clock signal is held in a given phase relationship with the transmission clock signal of the first data channel and whose reception clock signal is held in a given phase relationship with the reception clock signal of the first data channel.

9. Phase detector circuitry for measuring the phase of a data signal received from a signal line, the phase detector circuitry comprising:

a pair of data receivers each configured to receive the data signal from the signal line based on a corresponding reception clock signal and to generate an output signal based on the received data signal and synchronized with the corresponding reception clock signal; and a phase detector configured to measure a phase of the received data signal relative to phases of the reception clock signals based on said output signals, wherein:

the reception clock signals have different relative phases from one another so that the output signals have associated different relative phases from one another;

the phase detector is configured to measure the phase of the received data signal by detecting an edge of the received data signal relative to edges of the reception clock signals;

each output signal comprises a pulse signal having pulses synchronised with edges of the reception clock signal concerned, each pulse indicative of a data value of the data signal at a corresponding said edge;

each output signal comprises a first pulse signal having pulses synchronised with edges of the reception clock signal concerned at which the data signal has a logic 1 data value, or a second pulse signal having pulses synchronised with edges of the reception clock signal concerned at which the data signal has a logic 0 data value; and the phase detector is configured to determine that an edge of the data signal is between corresponding edges of the reception clock signals of the pair if the pulses from the data receivers of the pair which are synchronised with those edges indicate opposite data values.

10. Phase rotator circuitry, comprising:

a plurality of input nodes configured to receive respective clock signals of a plurality of time-interleaved candidate clock signals which have different phases from one another;

an output node; and selector circuitry operable, based on a selection signal, to adjust which one of the candidate clock signals is selected to be output at the output node via a corresponding path through the selector circuitry, wherein:

the selector circuitry comprises a plurality of logic gates via which the paths pass;

the paths comprise the same combinations of logic gates and interconnecting path lengths as one another such that the propagation delays of the candidate clock signals between the input and output nodes when selected are the same as one another;

the selector circuitry is operable, based on the selection signal, to adjust which one of an array of clock-select signals has a select state, the other clock-select signals of the array having a deselect state; and the selector circuitry is configured such that the clock-select signal having the select state causes a corresponding one of the candidate clock signals to be output as the transmission clock signal and the clock-select signals having the deselect state cause corresponding ones of the candidate clock signals to not be output as the transmission clock signal.

11. Integrated circuitry such as an IC chip comprising the circuitry as claimed in claim 1.

12. Phase detector circuitry as claimed in claim 9, wherein:

the phase detector circuitry comprises a set of data receivers operable based on a corresponding set of reception clock signals, the set of reception clock signals being time-interleaved such that they have different relative phases from on e another; and the set of data receivers are organised into a plurality of said pairs, the phase detector configured, for each said pair, to determine whether an edge of the data signal is between corresponding edges of the reception clock signals of the pair.

13. Phase detector circuitry as claimed in claim 12, wherein the phase detector comprises a latch for each pair of data receivers; and each latch is configured, when an overlap is detected for its pair of data receivers, to output an overlap signal, and, when an overlap is detected for another pair of data receivers, to output a non-overlap signal.

14. Phase detector circuitry as claimed in claim 13, wherein each latch is configured to:

maintain an output overlap signal until the detection of an overlap for another pair of data receivers, causes it to output a non-overlap signal; and maintain an output non-overlap signal until an overlap detected for its pair of data receivers causes it to output an overlap signal.

* * * * *